(12) United States Patent
Zhang et al.

(10) Patent No.: US 10,707,308 B2
(45) Date of Patent: Jul. 7, 2020

(54) HETERO-EPITAXIAL OUTPUT DEVICE ARRAY

(71) Applicants: Guobiao Zhang, Corvallis, OR (US); Peter Y. Yu, Oakland, CA (US)

(72) Inventors: Guobiao Zhang, Corvallis, OR (US); Peter Y. Yu, Oakland, CA (US)

(73) Assignees: HangZhou HaiCun Information Technology Co., Ltd., HangZhou, ZheJiang (CN); Guobiao Zhang, Corvallis, OR (US)

( * ) Notice: Subject to any disclaimer, the term of this patent is extended or adjusted under 35 U.S.C. 154(b) by 0 days.

(21) Appl. No.: 16/231,934

(22) Filed: Dec. 24, 2018

(65) Prior Publication Data
US 2019/0198624 A1   Jun. 27, 2019

Related U.S. Application Data

(60) Provisional application No. 62/631,646, filed on Feb. 17, 2018.

(30) Foreign Application Priority Data

Dec. 24, 2017   (CN) .......................... 2017 1 1413902
Dec. 26, 2017   (CN) .......................... 2017 1 1432316

(51) Int. Cl.
| H01L 29/20 | (2006.01) |
| H01L 23/00 | (2006.01) |
| H01L 27/088 | (2006.01) |
| H01L 27/06 | (2006.01) |
| H01L 21/8252 | (2006.01) |
| H01L 21/66 | (2006.01) |
| H01L 29/06 | (2006.01) |

(52) U.S. Cl.
CPC ...... H01L 29/2003 (2013.01); H01L 21/8252 (2013.01); H01L 22/22 (2013.01); H01L 24/49 (2013.01); H01L 27/0605 (2013.01); H01L 27/088 (2013.01); H01L 29/0696 (2013.01)

(58) Field of Classification Search
CPC .................................................. H01L 27/088
See application file for complete search history.

(56) References Cited

U.S. PATENT DOCUMENTS

| 5,620,745 A | 4/1997 | Simpson |
| 6,110,277 A | 8/2000 | Braun |
| 6,163,557 A | 12/2000 | Dunnrowicz et al. |
| 6,218,280 B1 | 4/2001 | Kryliouk et al. |
| 6,225,650 B1 | 5/2001 | Tadatomo et al. |
| 6,261,929 B1 | 7/2001 | Gehrke et al. |
| 6,486,042 B2 | 11/2002 | Gehrke et al. |

(Continued)

OTHER PUBLICATIONS

Tanaka et al. "Si Complies with GaN to Overcome Thermal Mismatches for the Heteroepitaxy of Thick GaN on Si", Advanced Materials, vol. 29, 20.

*Primary Examiner* — Yu-Hsi D Sun

(57) ABSTRACT

A GaN-on-Si output transistor array comprises a plurality of small monolithic output transistors. The substrate surface has multiple grids, upon which multiple pieces of the small monolithic GaN films are grown epitaxially on the silicon substrate. Each small monolithic output transistor is formed in a respective small monolithic GaN film. By disabling defective transistors, the overall yield/reliability is improved.

20 Claims, 23 Drawing Sheets

(56) References Cited

U.S. PATENT DOCUMENTS

| | | | |
|---|---|---|---|
| 6,682,991 B1 | 1/2004 | Hino et al. | |
| 6,969,627 B2 | 11/2005 | Pan et al. | |
| 6,982,435 B2 | 1/2006 | Shibata et al. | |
| 7,378,288 B2 | 5/2008 | Tran et al. | |
| 7,535,089 B2 | 5/2009 | Fitzgerald | |
| 7,619,261 B2 | 11/2009 | Koide | |
| 7,655,490 B2 | 2/2010 | Ishiba | |
| 7,804,101 B2 | 9/2010 | Niki et al. | |
| 7,858,414 B2 | 12/2010 | Fudeta et al. | |
| 7,888,779 B2 | 2/2011 | Jiang et al. | |
| 7,915,747 B2 | 3/2011 | Matsushita | |
| 8,426,325 B2 | 4/2013 | Wang et al. | |
| 8,557,681 B2 | 10/2013 | Herman et al. | |
| 8,815,715 B2 | 8/2014 | Herman et al. | |
| 8,946,772 B2 | 2/2015 | Okagawa et al. | |
| 9,490,172 B2 | 11/2016 | Briere | |
| 9,564,320 B2 | 2/2017 | D'Evelyn et al. | |
| 9,650,723 B1 | 5/2017 | D'Evelyn et al. | |
| 10,023,974 B2 | 7/2018 | Mollart et al. | |
| 2018/0358221 A1* | 12/2018 | Carlson | H01L 21/0243 |

* cited by examiner

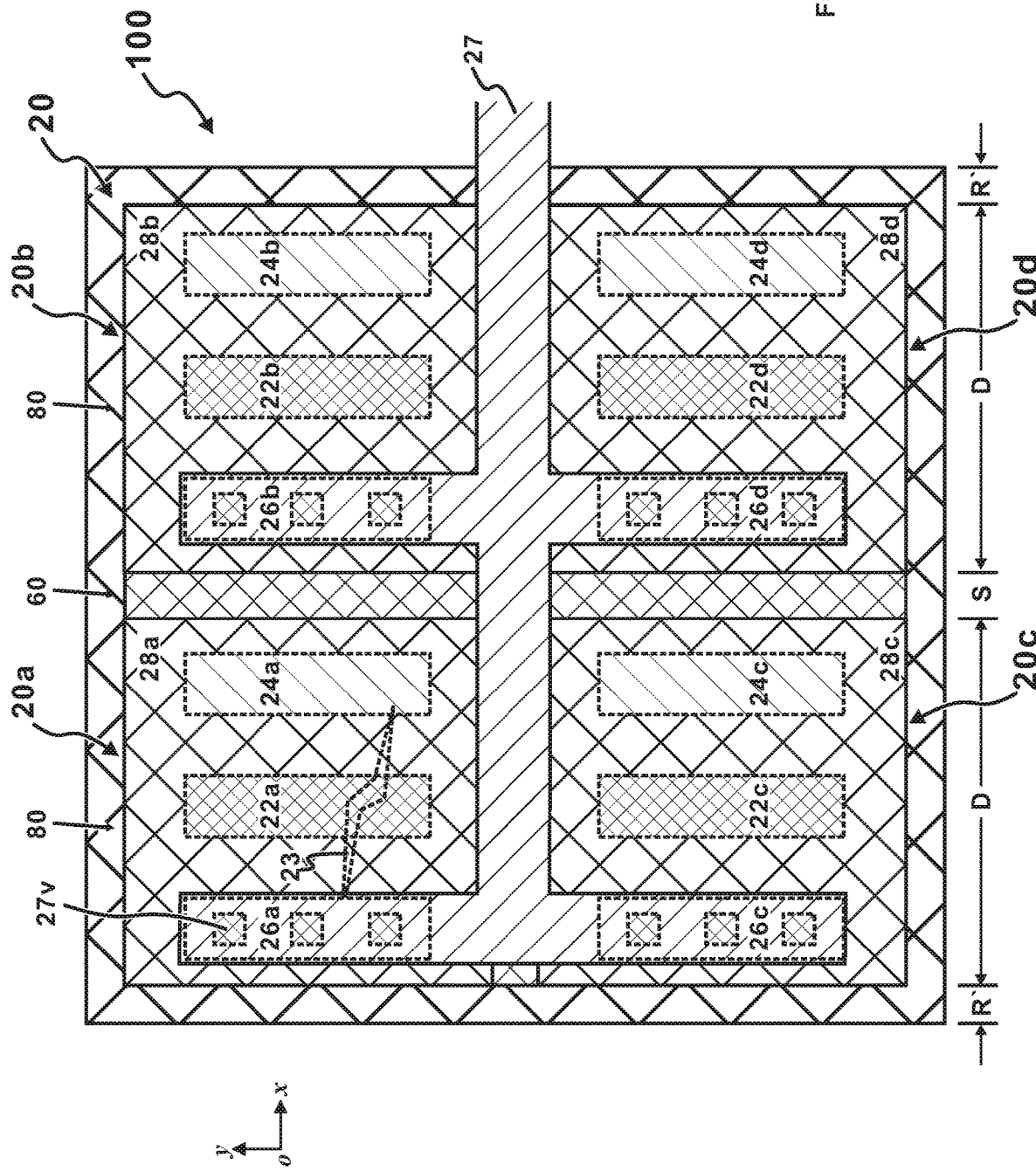

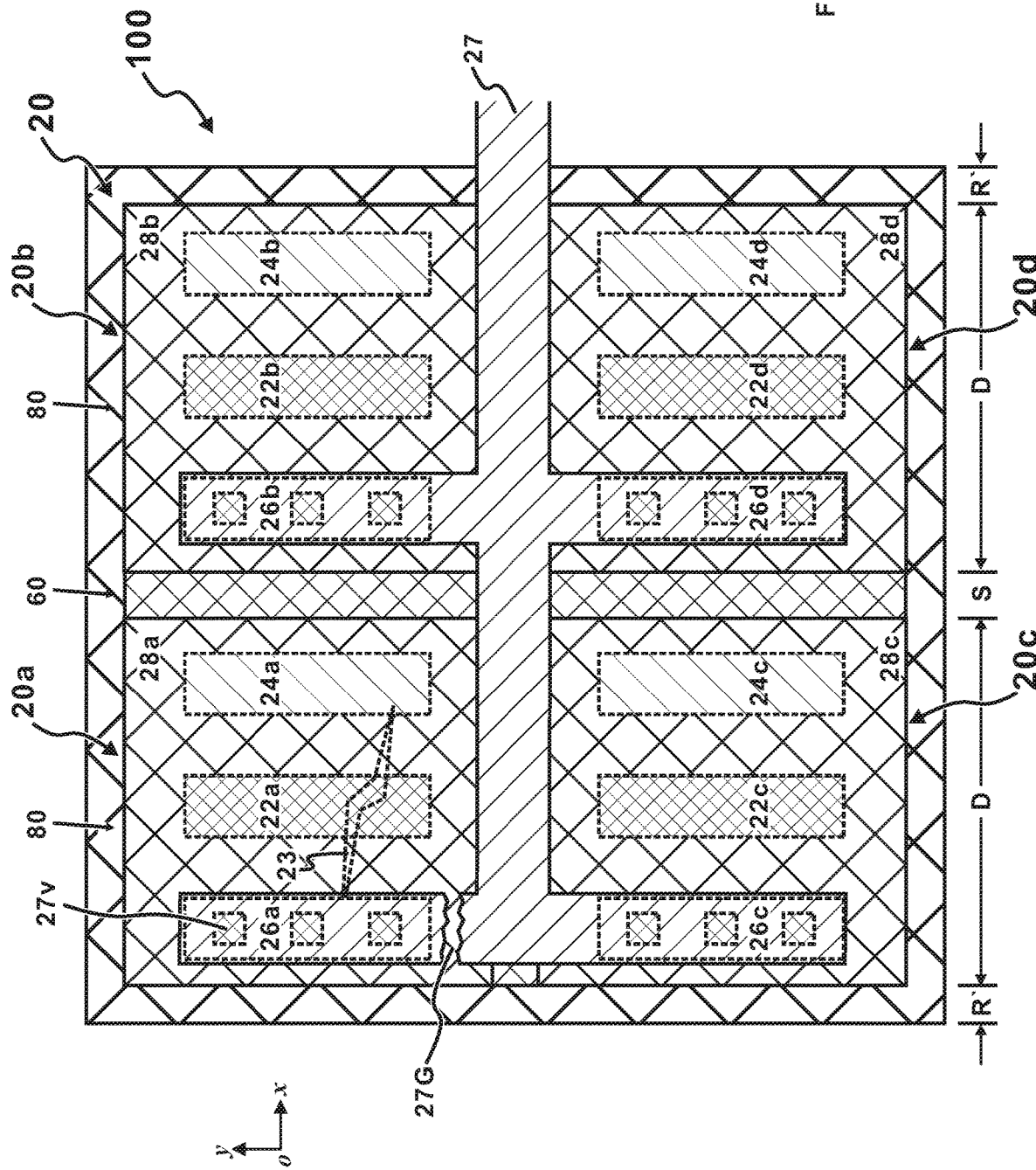

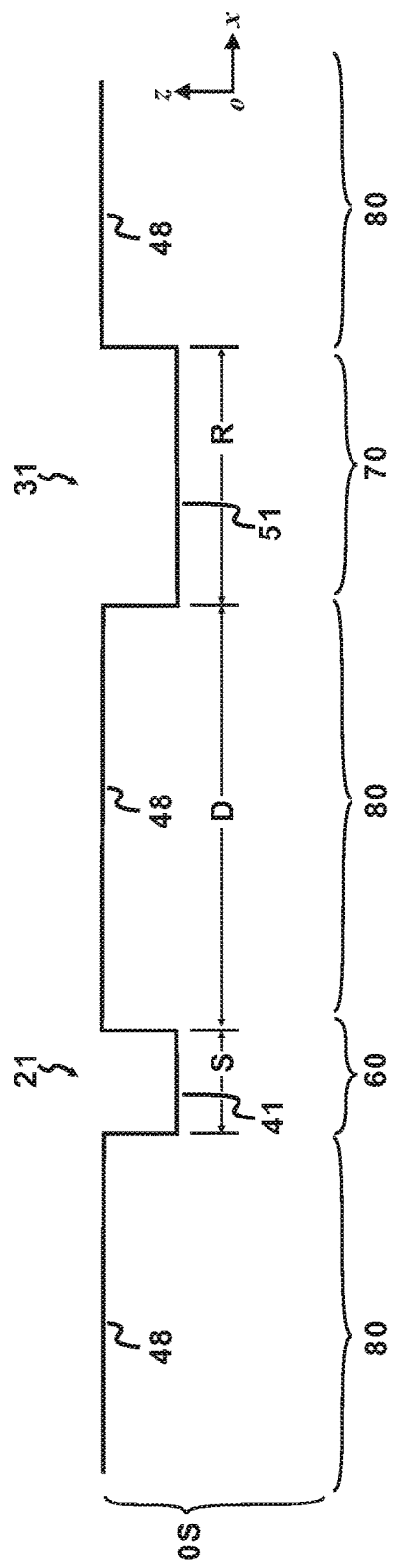
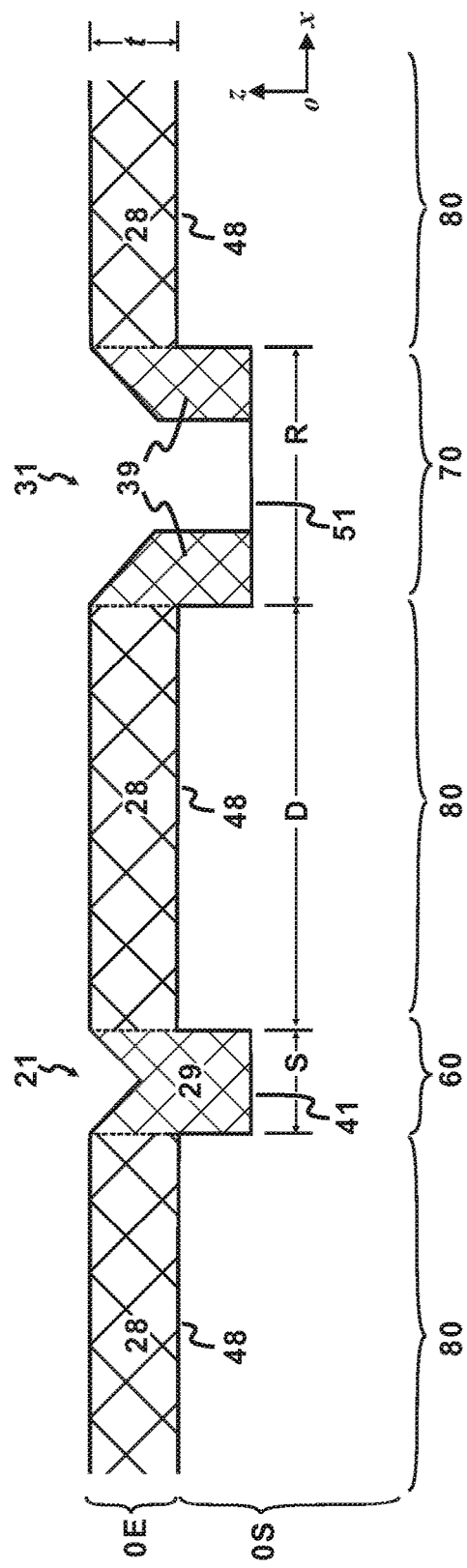

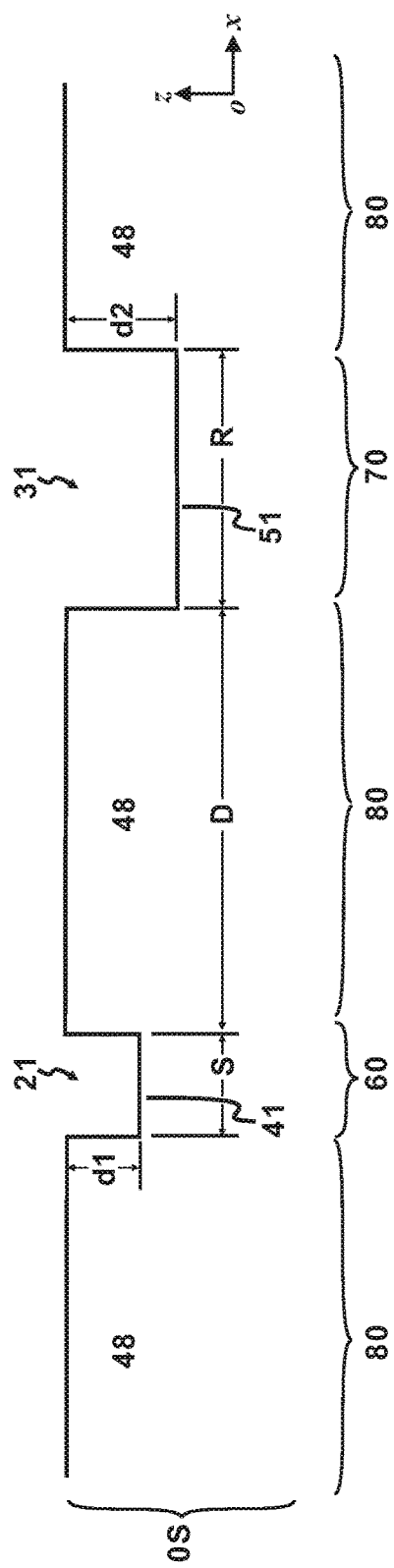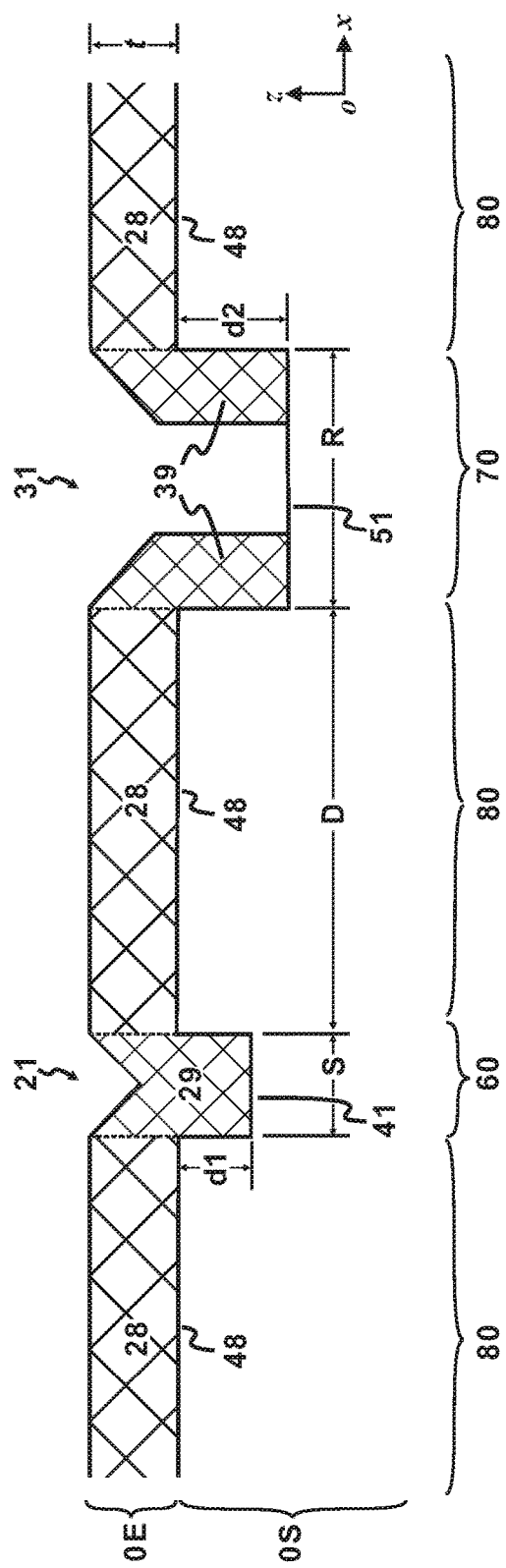
Fig. 16A
Fig. 16B

HETERO-EPITAXIAL OUTPUT DEVICE ARRAY

BACKGROUND

1. Technical Field of the Invention

The present invention relates to the field of power electronics, and more particularly to epitaxial power transistors.

2. Prior Art

Gallium nitride (GaN) is a semiconductor material widely used in power electronics and RF electronics. When used for power output, GaN output transistors need to support large currents and/or large voltages. Accordingly, these GaN output transistors are physically large.

To support large currents, the channel width W of the GaN transistors is large, ranging from hundreds of microns to centimeters, or even larger. FIG. 1A is a plan view of a prior-art large-current output transistor 10. It comprises a gate 12, a source 14 and a drain 16. They are formed in a GaN film 18 grown epitaxially on a silicon substrate 0S.

Because a GaN substrate is expensive, it is desirable to use a GaN-on-Si substrate (i.e. a GaN film grown epitaxially on a silicon substrate) to lower cost. FIG. 1B is a cross-sectional view of a GaN-on-Si transistor 10. During manufacturing, a GaN film 18 is grown epitaxially on a silicon substrate 0S, followed by the formation of a barrier layer 15. After the source/drain trenches are etched, a metal film is deposited to form the gate 12, the source 14 and the drain 16.

To support large voltages, the channel length L of the GaN transistors is large. FIGS. 9A-9B disclose a prior-art large-voltage output transistor 10. Similarly, it comprises a gate 12, a source 14 and a drain 16. They are formed in a GaN film 18 grown epitaxially on a silicon substrate 0S.

Due to lattice mismatch and thermal mismatch, the GaN film 18 on the silicon substrate 0S could have a high defect density. To be more specific, the lattice constant of GaN is 3.189, whereas that of silicon is 5.43. They differ by −16.9%. On the other hand, the thermal expansion coefficient (TEC) of GaN is $5.59 \times 10^{-6}$/K, whereas that of silicon is $3.59 \times 10^{-6}$/K. They differ by 36%. Because epitaxy is carried out at a high temperature (~1000° C.), a large compressive stress will be built in the GaN film 18 when the silicon wafer 0S cools down. Once the compressive stress reaches a critical value, cracks will be generated in the GaN film 18. Cracking becomes worse for larger or thicker GaN films 18.

Prior art uses a large monolithic transistor for power output. The large monolithic transistor is formed in a large piece of the monolithic semiconductor film (e.g. a monolithic GaN film). As used hereinafter a monolithic semiconductor film is a single piece of continuous and uniform semiconductor film. For the silicon-based transistor, a large monolithic silicon transistor can still achieve a reasonable yield, as the defect density in the silicon substrate is low. However, for the GaN-on-Si transistor, because the GaN film has a large defect density, there is a strong likelihood that a large monolithic GaN film 18 would contain at least a defect 13. As a single defect 13 could kill a GaN transistor, a large monolithic GaN transistor 10 has a poor yield.

Patterned substrate can lower the defect density of the GaN film. FIGS. 2A-2B are plan and cross-sectional views of a patterned substrate, respectively. During manufacturing, a grid 40 is formed on the silicon substrate (FIG. 3A). The grid 40 in FIG. 3B is a trench 11. It divides the substrate 0S into a plurality of device regions 50. A single piece of the monolithic GaN film 18 is grown epitaxially in each device region 50. Because of the existence of the trench 11, the GaN films 0E formed near the edges of the trench 11 contain latent damages, which could be easily developed into cracks when exposed to stress during the wafer cool-down. Because these cracks help to relieve the stress in the GaN film 0E, random cracks are less likely to occur in the device regions 50. Hence, a lower defect density can be achieved. In real life, each edge of the grid 40 physically contains a separation structure 11. The area occupied by the separation structure 11 is referred to as the separation region 40. The separation structures 11 could be concave structures (e.g. trenches) and/or convex structures (e.g. posts).

Prior art uses a single-patterned substrate to lower the density of the GaN film. The single-patterned substrate uses only a single type of grid 40, where the widths s of all separation structures 11 are same, while the dimension d of all device regions 50 are same. In general, the smaller the width s of the separation structure 11, or the larger the dimension d of the device regions 50, the more stress would be accumulated and therefore, the larger defect density would be generated. To lower the defect density, the separation structure 11 preferably has a large width s, or the device region 50 preferably has a small dimension d. Unfortunately, this would lead to a lower substrate efficiency and then a lower productivity. As used hereinafter the substrate efficiency is the ratio between the overall area of the device regions 50 and the overall area of the substrate 0S.

Objects and Advantages

It is a principle object of the present invention to improve the yield of the GaN-on-Si output transistors.

It is a further object of the present invention to improve the reliability of the GaN-on-Si output transistors.

It is a further object of the present invention to improve the productivity of the GaN-on-Si output transistors.

It is a further object of the present invention to extend the inventive spirit of the present invention to other hetero-epitaxial semiconductor films and devices.

In accordance with these and other objects of the present invention, the present invention discloses a hetero-epitaxial output device array, more particularly, a hetero-epitaxial output transistor array.

SUMMARY OF THE INVENTION

To improve yield and/or reliability, the present invention combines patterned-substrate and transistor array. Instead of a single piece of the large monolithic GaN film, multiple pieces of the small monolithic GaN films are grown epitaxially on a patterned substrate. In addition, a large monolithic output transistor is decomposed into an array of small monolithic output transistors. Each small monolithic output transistor is formed in a respective small monolithic GaN film. The overall yield and/or reliability of the transistor array are improved by disabling the defective small monolithic output transistors (hereinafter "defective transistors").

The present invention is a perfect combination of patterned substrate and transistor array. It has two advantages. First, the small monolithic GaN films have a lower defect density because stress cannot be easily built up therein. Although the patterned substrate has been studied for years, it is still difficult to grow good-quality GaN films with a dimension of hundreds of microns and a thickness of tens of microns. Decomposing a large transistor into multiple small monolithic transistors relieves the pressure to grow a large monolithic GaN film. Secondly, because they have smaller footprints, the small monolithic transistors have a better yield per se. Yield can be further improved by disabling all defective transistors during manufacturing. Moreover, reliability can be improved by disabling all aged small monolithic output transistors (hereinafter "aged transistors") during usage. As a result, even though they are part of the transistor array, the defective or aged transistors would not affect the overall performance or the lifetime of the transistor array.

The number of the small monolithic output transistors without defects (hereinafter "normal transistors") in the transistor array represents the current drive or voltage rating of the transistor array. Because the number of the defective transistors could be different for different transistor arrays, the finished transistor arrays could have varying performance after disabling the defective transistors. Before shipping, the finished transistor arrays can be sorted according to the number of the normal transistors. On the other hand, during the product design, redundancy can be designed into the transistor array, i.e. the number of the small monolithic output transistors in the transistor array could be over-designed. Once an aged transistor fails during usage, by simply disabling this failed transistor, the overall performance of the transistor array would not be affected, thus extending the lifetime of the transistor array.

To improve the productivity of the transistor array, the present invention further discloses a multiple-patterned substrate. It uses at least two types of grids: a first grid surrounds each monolithic transistor and separates adjacent monolithic transistors; and, a second grid surrounds the whole transistor array. The first grid uses narrow separation structures, which can partially relieve stress while maintaining a good substrate efficiency. The second grid uses wide boundary structures, which can relieve stress more effectively. To achieve a good productivity, the second grid preferably coincides with the dicing streets (or, saw streets, scribe lines). Hence, even though wide boundary structures are used, the second grid would not use the valuable die area. Accordingly, the substrate efficiency is still maintained and the productivity of the transistor array remains good.

Accordingly, the present invention discloses a hetero-epitaxial output device array, comprising: a substrate comprising a substrate material; a semiconductor film grown epitaxially on said substrate comprising a semiconductor material with different lattice constant and/or thermal expansion coefficient from said substrate material, wherein said semiconductor film comprises first, second and third device regions separated by at least a separation region, the semiconductor films in said first, second and third device regions are different from the semiconductor film in said separation region; first, second and third output devices respectively formed in said first, second and third device regions, wherein said first output device is a defective device and disabled, said second and third output devices are normal devices and communicatively coupled.

The present invention further discloses another hetero-epitaxial output device array, comprising: a substrate comprising a substrate material; a semiconductor film grown epitaxially on said substrate comprising a semiconductor material with different lattice constant and/or thermal expansion coefficient from said substrate material, wherein said semiconductor film comprises a plurality of device regions separated by at least a separation region, the semiconductor films in said plurality of device regions are different from the semiconductor film in said separation region; a plurality of output devices respectively formed in said plurality of device regions, said output devices including at least a defective output device and a plurality of normal output devices, wherein said defective output device is disabled; and, said normal output devices are communicatively coupled.

The present invention further discloses a hetero-epitaxial semiconductor device, comprising: a substrate comprising a substrate material; a semiconductor film grown epitaxially on said substrate comprising a semiconductor material with different lattice constant and/or thermal expansion coefficient from said substrate material, wherein said semiconductor film comprises a plurality of device regions; at least a separation region surrounding selected one of said plurality of device regions; a boundary region surrounding all of said plurality of device regions; wherein the semiconductor films in said device regions, the semiconductor film in said separation region and the semiconductor film in said boundary region are different.

BRIEF DESCRIPTION OF THE DRAWINGS

FIGS. 7A-7B are plan views of another preferred parallel-connected transistor array before and after selective cutting.

FIG. 15A is a cross-sectional view of a first preferred substrate pattern before epitaxial growth; FIG. 15B is a cross-sectional view of a first preferred GaN film after epitaxial growth.

FIG. 16A is a cross-sectional view of a second preferred substrate pattern before epitaxial growth; FIG. 16B is a cross-sectional view of a second preferred GaN film after epitaxial growth.

Figure 1A:
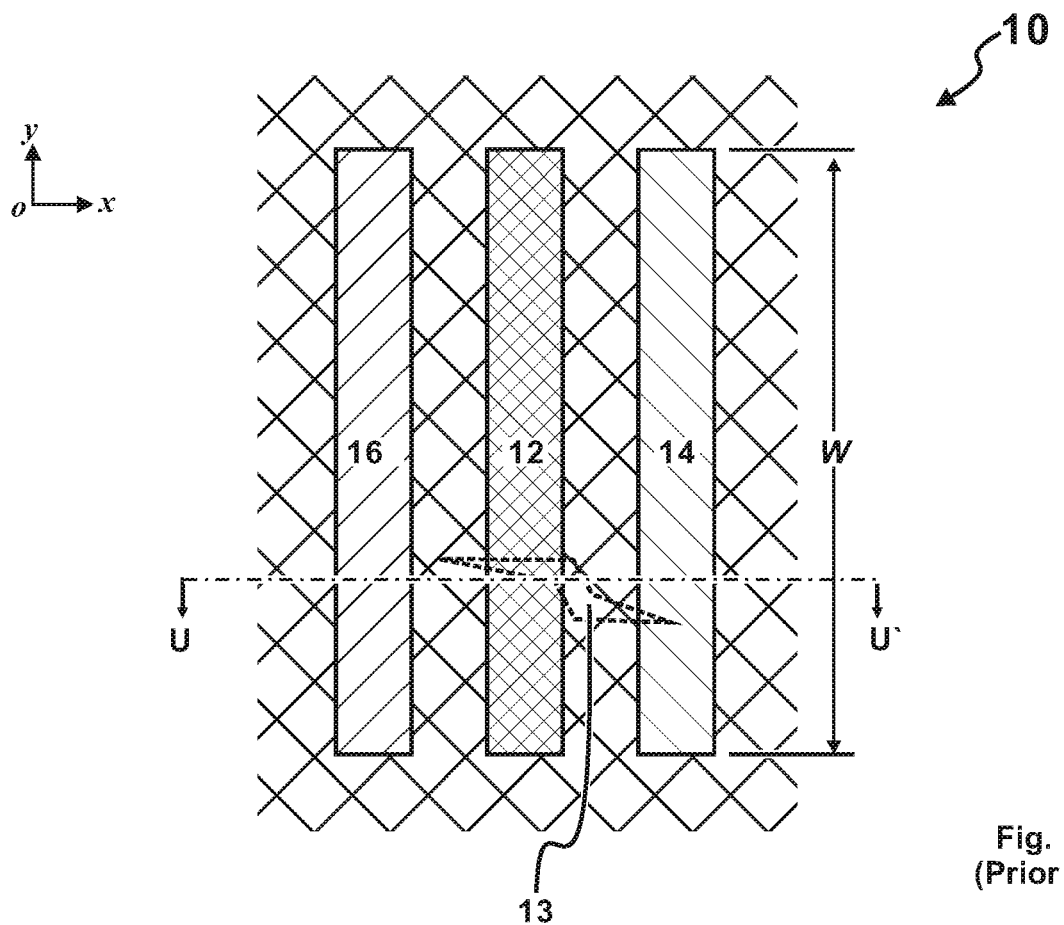
FIG. 1A is a plan view of a large monolithic output transistor supporting a large current (prior art)

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

Figure 2A:
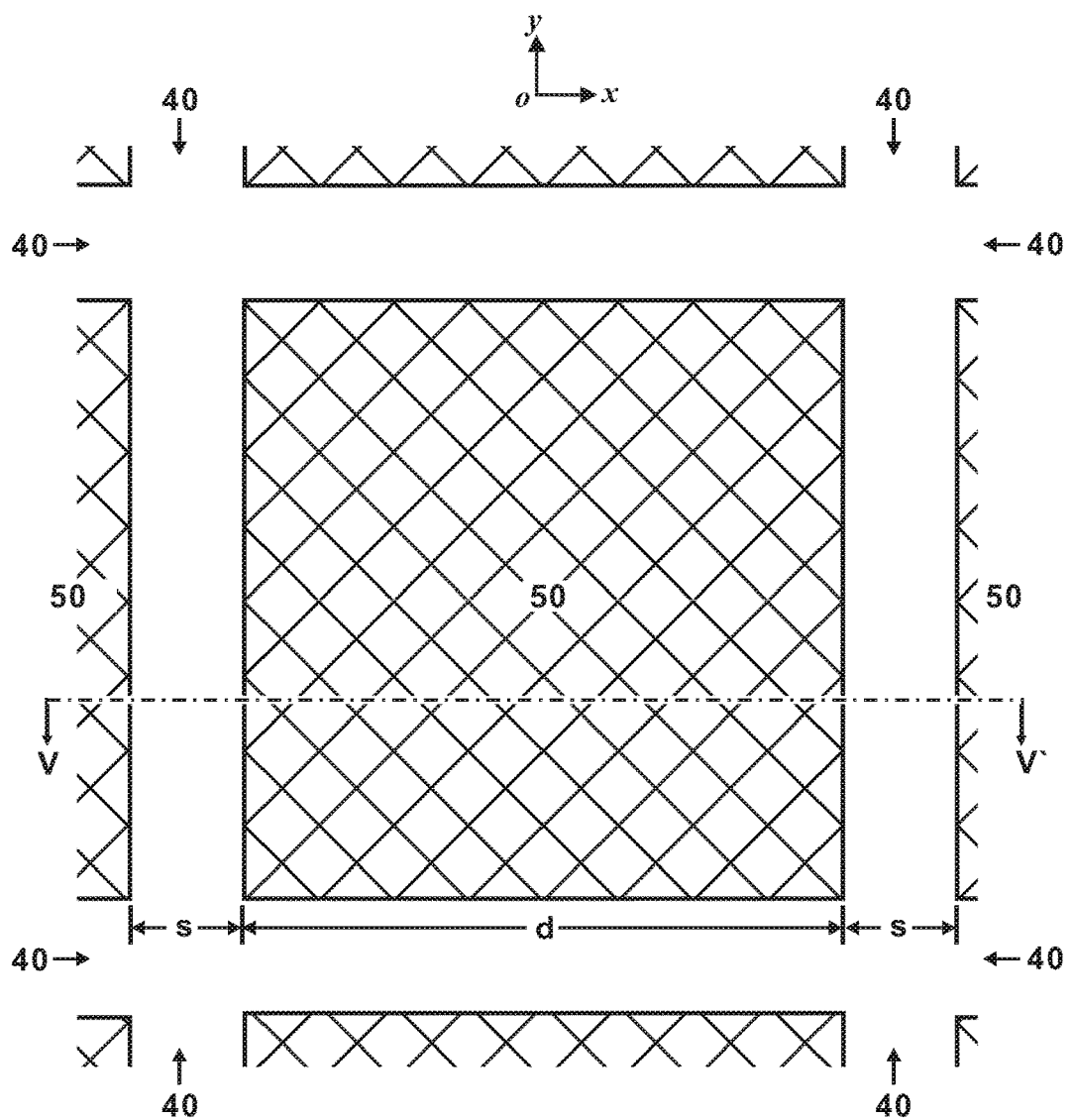
FIG. 2A is a plan view of a single-patterned substrate (prior art)
Figure 2B:
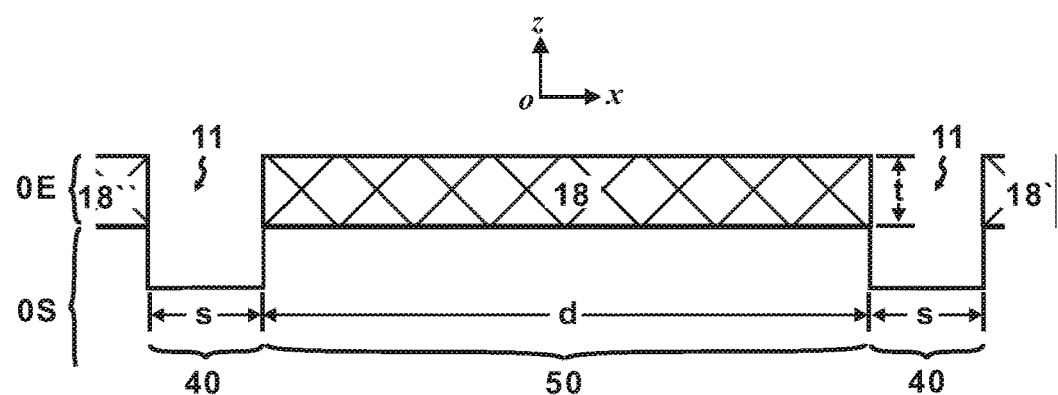
FIG. 2B is its cross-sectional view along the cut-line V-V' (prior art).
Figure 3A:
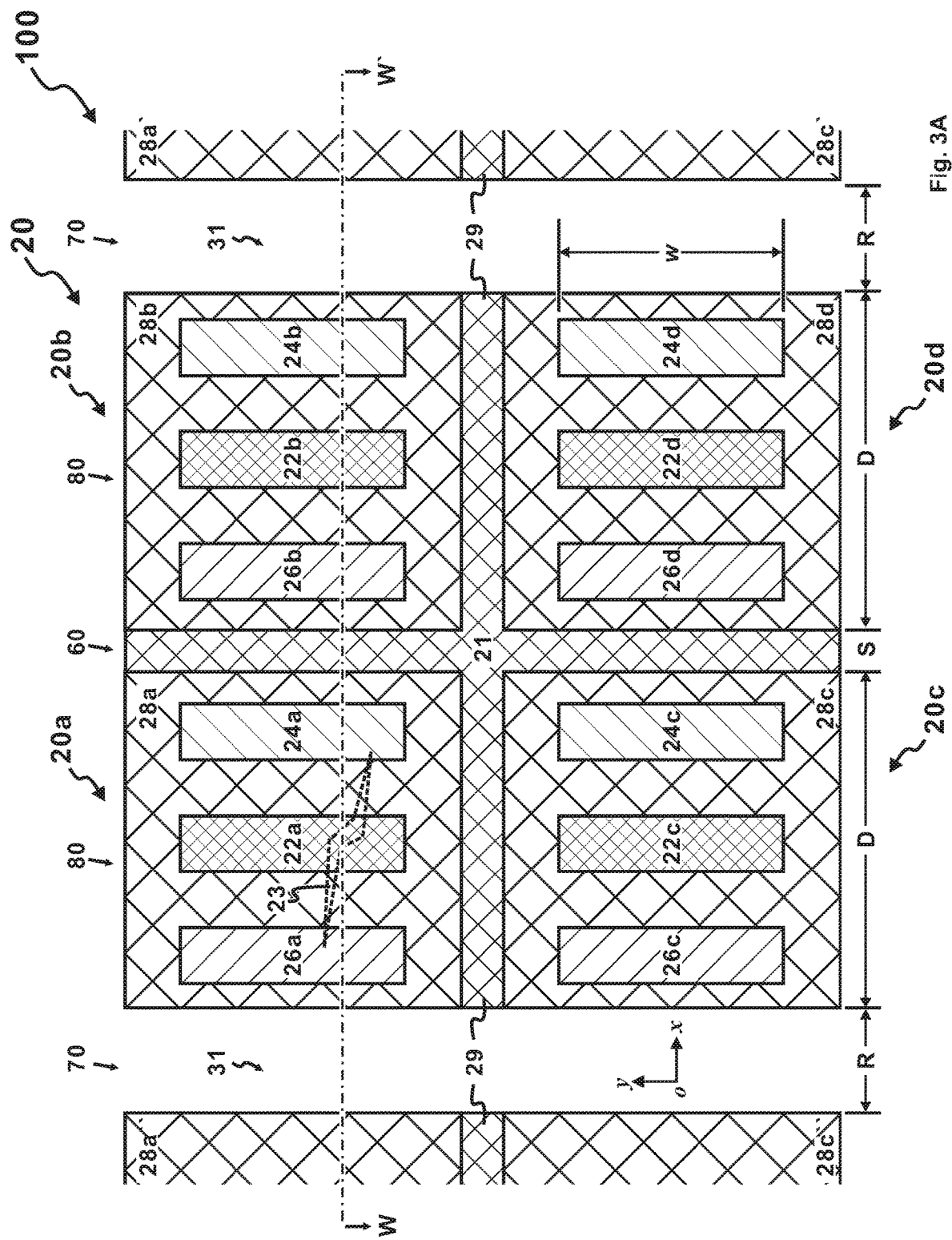
FIG. 3A is a plan view of a wafer comprising a preferred parallel-connected transistor array.

The structures indicated by dashed lines are lower-level structures, which are generally covered by the upper-level structures. For reason of simplicity, the barrier layers 15, 25 are not shown in all plan views (e.g. FIG. 1A, FIG. 5A, FIG. 6A, FIGS. 7A-7B, FIG. 9A, and FIG. 10B); the buffer layer and other stress-releasing layers are not shown in all cross-sectional views (e.g. FIG. 1B, FIG. 2B, FIG. 3B, FIG. 4B, FIG. 9B, FIG. 10C, and FIGS. 12-18B); the GaN film in the trenches 11, 12 are not shown in some cross-sectional views (e.g. FIG. 2B, FIG. 3B); only the adjacent transistor arrays along the x direction are shown in FIG. 3A, the adjacent transistor arrays along the y direction are not shown.

The symbol "/" indicates a relationship of "and" or "or". The phrase "communicatively coupled" is used in its broadest sense to mean any coupling whereby information may be passed from one element to another element; the phrase "a circuit in the substrate" means its active elements (e.g. transistors) or portions thereof are formed in the substrate, even though the interconnects coupling these active elements are still located above the substrate.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

To improve the yield and/or reliability of a GaN-on-Si output transistor supporting a large current, the present invention discloses a parallel-connected transistor array. The large output transistor is decomposed into an array of parallel-connected small monolithic output transistors, each of which is formed in a device region defined by a small monolithic GaN film. A defective transistor can be disabled by cutting the physical connection to the output of the transistor array, or biasing its input to force the transistor into a cut-off mode. In the meantime, all normal transistors are communicatively coupled and generate output. FIGS. 3A-8B disclose more details on the preferred parallel-connected transistor array.

Referring now to FIGS. 3A-4B, a preferred parallel-connected transistor array 20 is disclosed. FIGS. 3A-3B disclose a wafer 100 containing the preferred parallel-connected transistor array 20; while FIGS. 4A-4B disclose a die 200 containing the preferred parallel-connected transistor array 20. Here, the die 200 is cut from the wafer 100. The substrate 0S has multiple patterns (referring to FIGS. 15A-18B), including a first grid 60 and a second grid 70. The first grid 60 divide the substrate 0S into multiple device regions 80. Each device region 80 has a continuous and smooth surface. It is surrounded by a separation structure 21, which also separates adjacent device regions 80. In the meantime, the whole transistor array 20 is surrounded by the boundary structure 31.

Figure 1B:
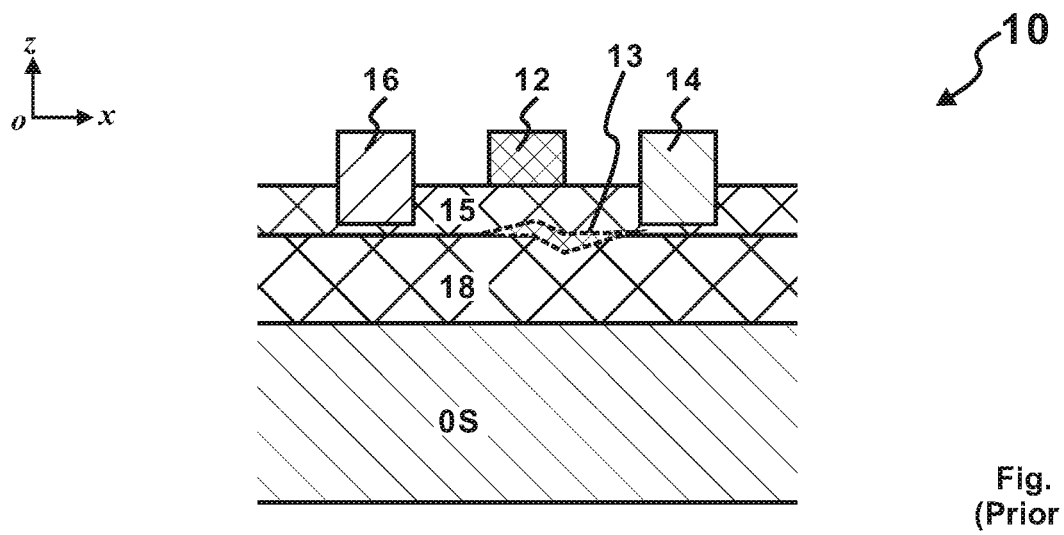
FIG. 1B is its cross-sectional view along the cut-line U-U' (prior art).
Figure 3B:
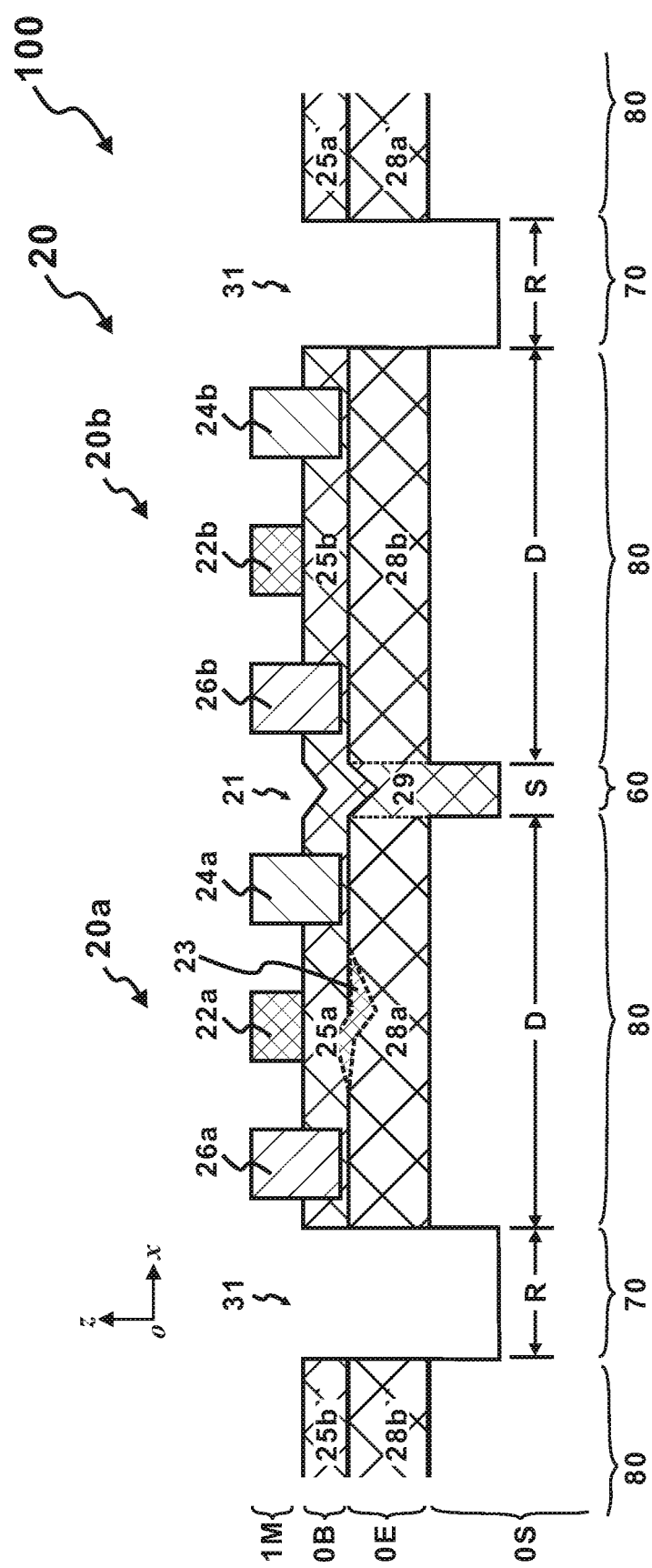
FIG. 3B is its cross-sectional view along the cut-line W-W'.

Compared with the transistor 10 of FIGS. 1A-1B, the transistors 20a-20d in FIGS. 3A-3B are small transistors while the transistor 10 is a large transistor. Because the large transistor 10 is decomposed into four parallel-connected small transistors 20a-20d, the channel width w of each small transistor (e.g. 20a) is about a quarter of the channel width W of the large transistor 10. With a shorter channel width wand therefore a smaller footprint, the likelihood for the small transistors 20a-20d to contain a defect 23 becomes smaller. It should be also noted that the width R of the boundary structure 31 is larger than the width S of the separation structure 21; and, the dimension D of the device region 80 is larger than the widths S and R of the separation structure 21 and the boundary structure 31.

During manufacturing, a GaN film 0E is grown epitaxially on a silicon substrate 0S, followed by the formation of a barrier layer 0B. The GaN film 0E comprises four pieces of the monolithic GaN films 28a-28d. Because the device region 80 has a smooth surface before epitaxy, the GaN films 28a-28d grown thereon have a good quality. The monolithic GaN films 28a-28d are the device region 80 for four monolithic transistors 20a-20d, respectively. Each monolithic transistor (e.g. 20a) comprises a barrier layer (e.g. 25a), a gate (e.g. 22a), a source (e.g. 24a) and a drain (e.g. 26a). If a monolithic transistor 20a contains a defect 23, this defect 23 will only affect the performance of the associated transistor 20a, but not the performance of other monolithic transistors 20b-20d. As a result, the performance of the whole transistor array 20 can be ensured by disabling the defective transistor 20a.

To achieve a reasonable substrate efficiency, the separation structure (e.g. trench) 21 preferably has a small width S, e.g. ranging from microns to tens of microns. This way it won't waste too much die area. During hetero-epitaxy, the GaN films 28a, 28b will grow laterally from both edges of the trench 21 to eventually coalesce. At this time, a GaN film 29 is formed in the trench 21 (FIG. 3B). Because it is grown in the trench 21, this GaN film 29 has a worse quality than that grown on the device region 80. As stress can pass through this GaN film 29, the trench 21 can only partially relieve the stress.

To relieve stress more effectively, the boundary structure (e.g. trench) 31 preferably has a large width D, e.g. ranging from tens of microns to hundreds of microns. Even though the GaN films 28b, 28a' grow laterally, they cannot coalesce to form a continuous GaN film. This is equivalent to intentionally introducing a crack. With this intentionally introduced crack, the trench 31 can relieve stress more effectively. To occupy less die area, the trench 31 preferably coincides with the dicing street. Because the dicing street needs to be formed anyway and its width also ranges from tens of microns to hundreds of microns, the dicing street is suitable for the boundary structure.

Figure 4A:
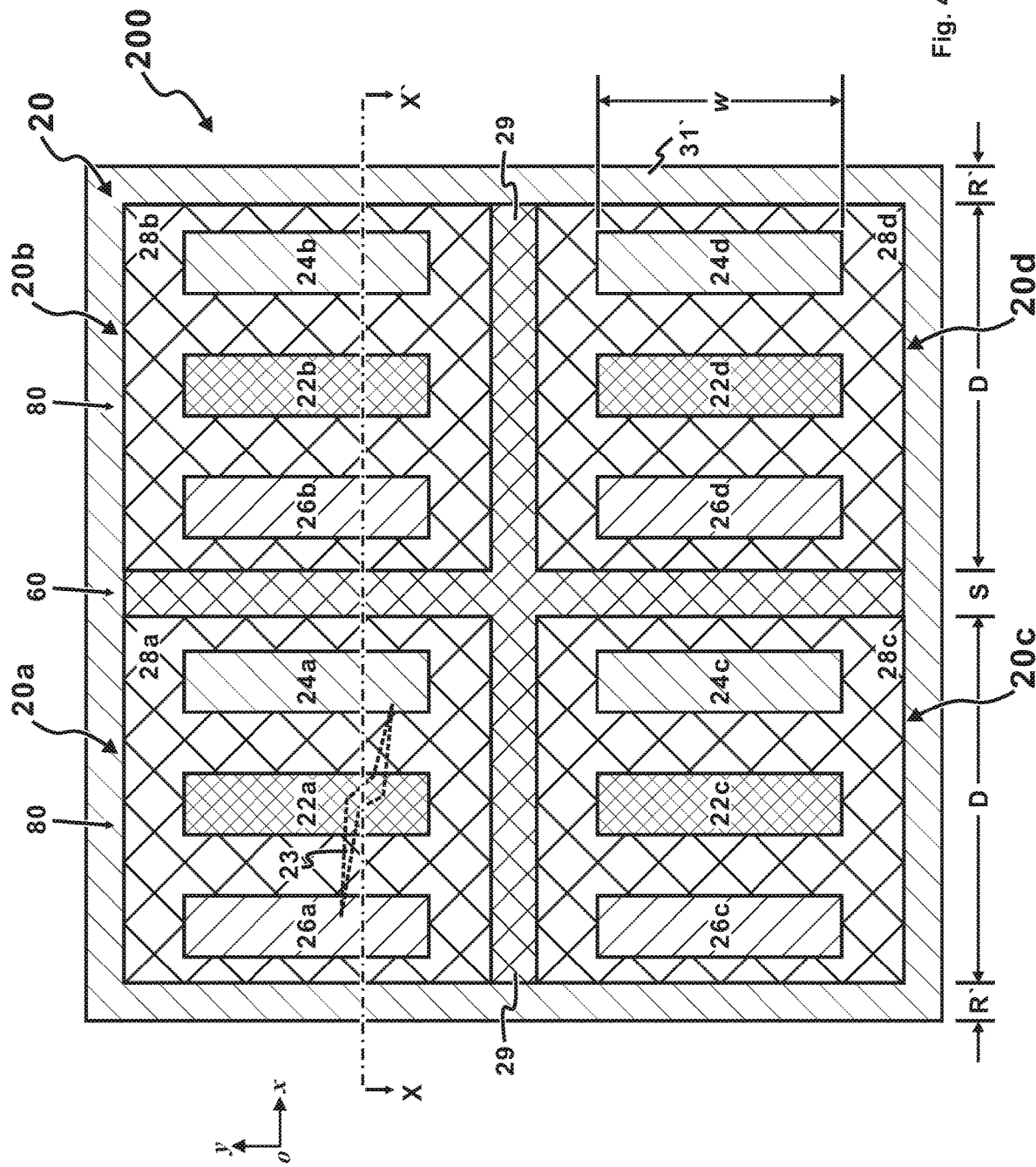
FIG. 4A is a plan view of a die comprising a preferred parallel-connected transistor array.
Figure 4B:
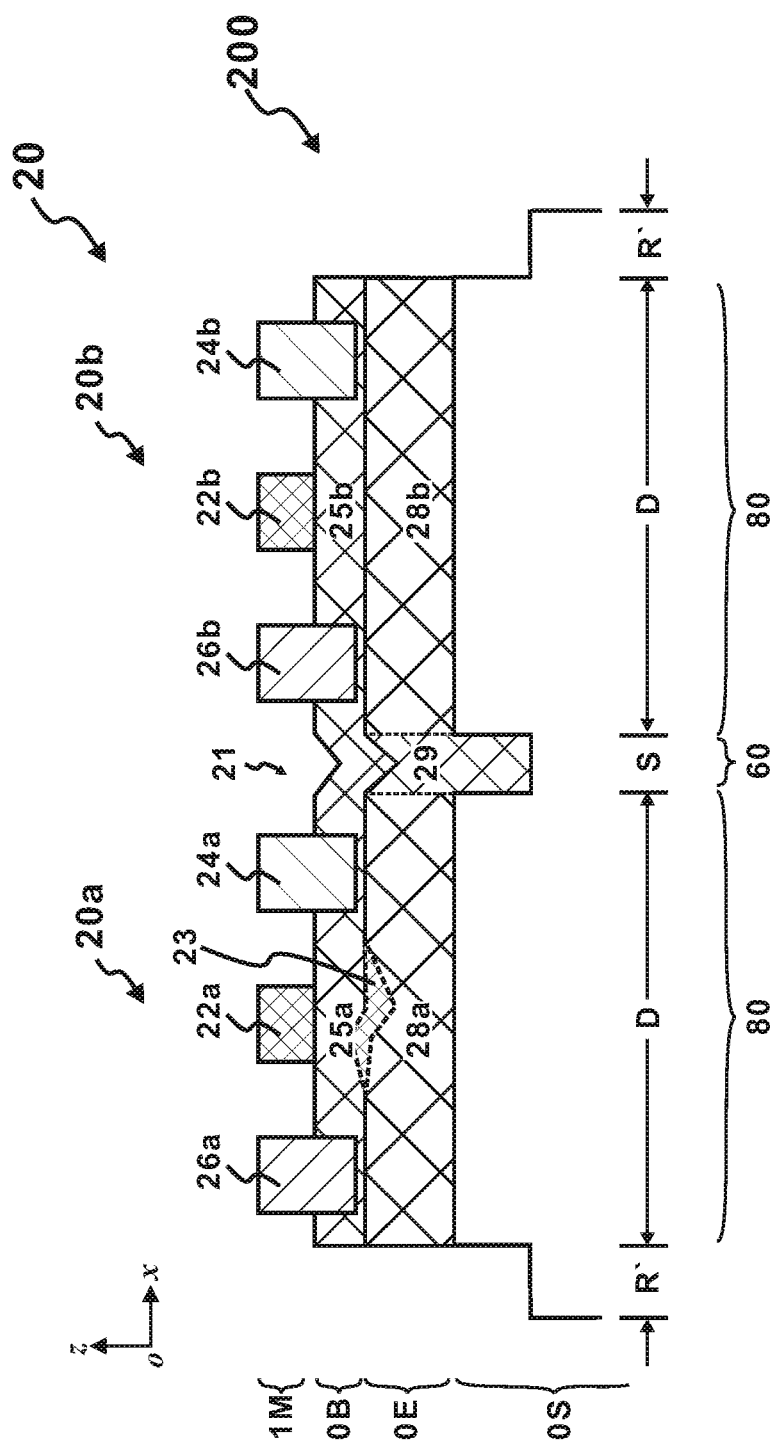
FIG. 4B is its cross-sectional view along the cut-line X-X'.

After dicing the transistor-array wafer 100, the transistor array 20 becomes a transistor-array die 200 (FIG. 4A). The region between the transistor array 20 and the edge of the die 200 is an edge region 31'. The width R' of the edge region 31' is preferably larger than the width S of the trench 21; and, no GaN film exists in at least a portion of the edge region 31'.

Figure 5:
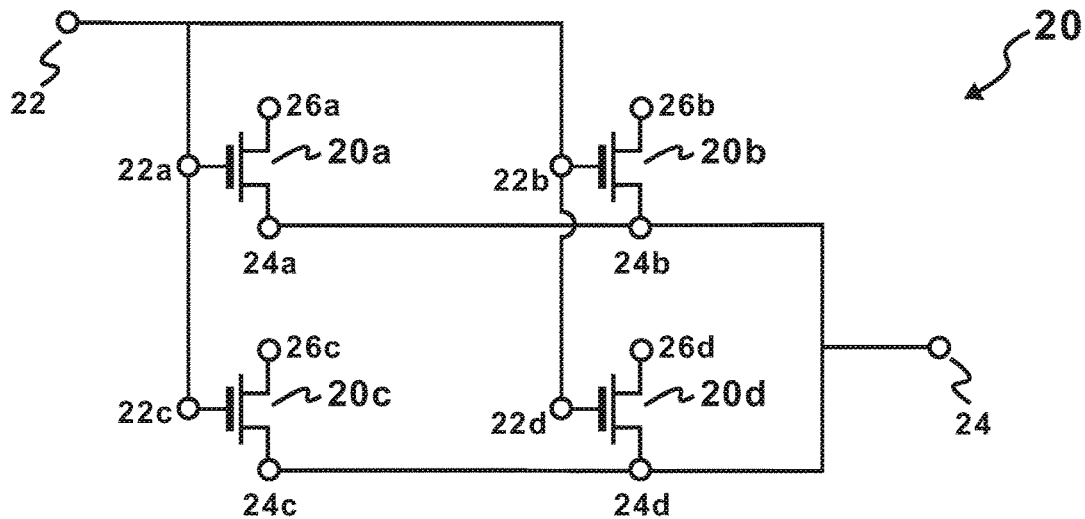
FIG. 5 is a circuit diagram of a preferred parallel-connected transistor array suitable for testing and repair.

Referring now to FIG. 5, a preferred parallel-connected transistor array 20 suitable for testing and repair is disclosed. It includes four transistors 20a-20d with gates 22a-22d, sources 24a-24d, and drains 26a-26d. In this preferred embodiment, the sources 24a-24d of all transistors 20a-20d are connected to a common source test pad, while the gates 22a-22d of all transistors 20a-20d are connected to a common gate test pad. However, each of the drains 26a-26d of the transistors 20a-20d is connected to a respective drain test pad. In another preferred embodiment, all drains 26a-26d are connected to a common drain test pad, while each of the gates 22a-22d is connected to a respective gate test pad.

After making these connections, the transistor array 20 is tested and repaired. This process can be performed at the package level by selective bonding (FIGS. 6A-6B), or at the wafer level by selective cutting (FIGS. 7A-7B).

Figure 6A:
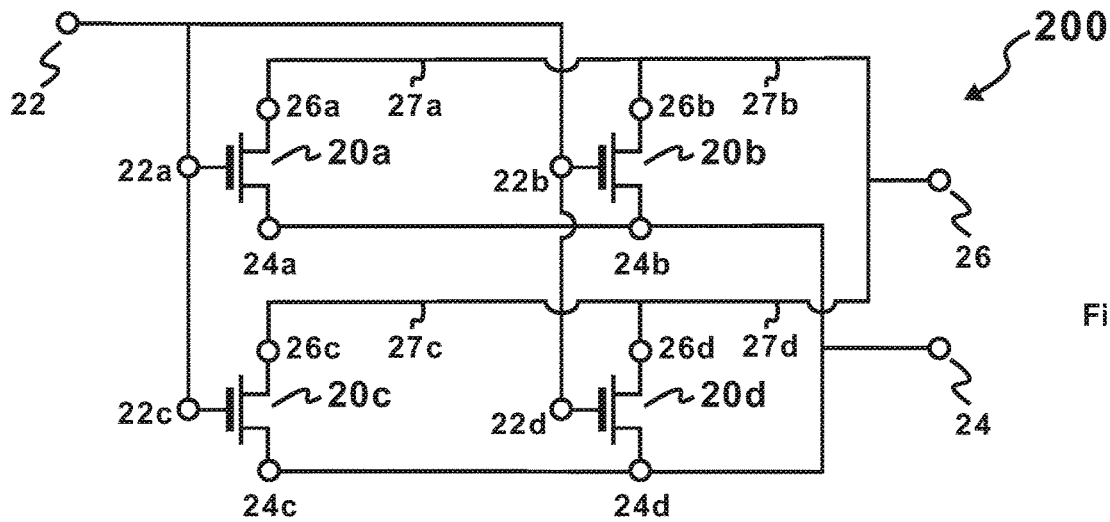
FIGS. 6A-6B are cross-sectional views of two preferred parallel-connected transistor arrays after selective bonding.
Figure 6B:
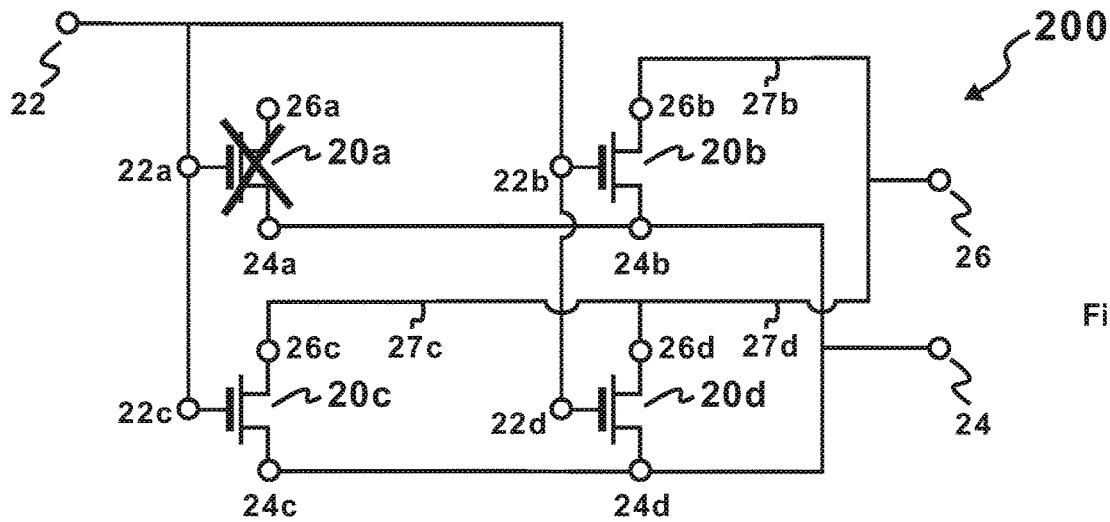

FIGS. 6A-6B disclose two preferred parallel-connected transistor arrays 20 after selective bonding. For these preferred embodiments, the transistor array 20 has been cut into a transistor-array die 200. First, a die-level test is performed. In the preferred embodiment of FIG. 6A, all transistors 20a-20d are found to be normal transistors at the die-level test. During packaging, the drains 26a-26d of all transistors 20a-20d are bonded to a drain pin 26 through four bond wires 27a-27d. Thus, all transistors 20a-20d (a total of four) generate output.

In the preferred embodiment of FIG. 6B, transistor 20a is found to be defective at the die-level test (denoted by symbol "X"), while three other transistors 20b-20d are found to be normal. During packaging, only the drains 26b-26d of three normal transistors 20b-20d are bonded to the drain pin 26 through three bond wires 27b-27d. Thus, only three transistors 20b-20d generate output. This means that the transistor array of FIG. 6B has a smaller current drive than that of FIG. 6A. These transistor-array dice 200 of FIGS. 6A-6B can be sorted according to their current drive before shipping.

FIGS. 7A-7B disclose another preferred parallel-connected transistor array 20 before and after selective cutting. It has a defective transistor 20a. After forming the first metal layer 1M (including the gate 22, the source 24 and the drain 26, referring to FIG. 3B and FIG. 4B), but before forming the second metal layer 27 (referring to FIG. 7A), a wafer-level test is performed to the transistor array 20. During this process, the probes on a probe card make contact with the common gate test pad 22, the common source test pad 24 and each drain test pad. Then a test voltage is applied on the common gate test pad 22 with the common source test pad 24 grounded. By measuring the current on the drain (e.g. 26a) of each transistor (e.g. 20a), a defective transistor 20a is identified if its current is out of range.

After the wafer-level test is complete, the backend-of-line (BEOL) process continues. The interconnect 27 is formed to connect all gates 22a-22d, all source 24a-24d and all drains 26a-26d, respectively. FIG. 7A shows the interconnect 27 right after the BEOL process. For reason of simplicity, the interconnect 27 is shown here to couple all drains 26a-26d though contacts 27v. FIG. 7B shows the interconnect 27 after selective cutting. For the defective transistor 20a, a laser beam is used to cut a gap 27G in the interconnect 27 coupling its drain 26a. This can prevent the defective transistor 20a from affecting the overall performance of the transistor array 20.

Figure 8A:
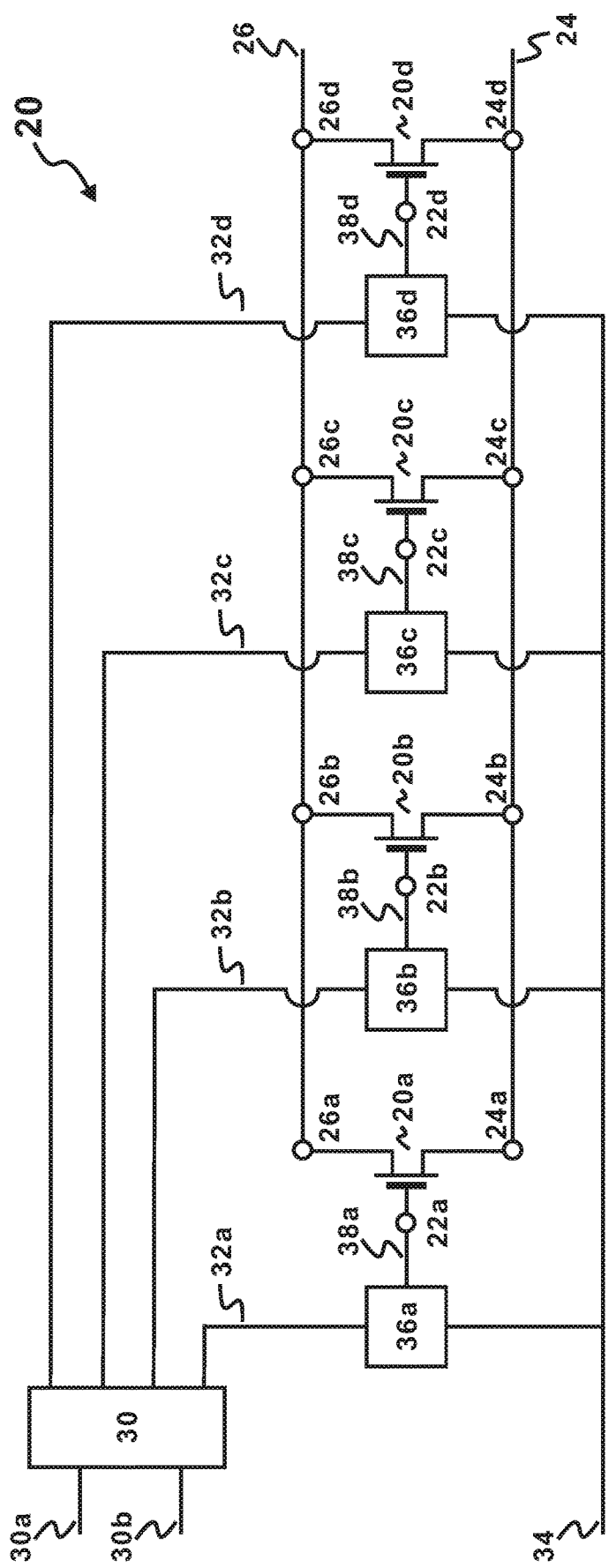
FIG. 8A is a circuit diagram of a preferred parallel-connected transistor array circuit suitable for self-testing and self-repair.

During the usage of the transistor array 20, it is unavoidable that certain transistor will fail due to aging. To improve its reliability, FIGS. 8A-8B disclose a preferred parallel-connected transistor array circuit (hereinafter "array circuit") 20 suitable for self-testing and self-repair. This preferred array circuit 20 comprises four monolithic transistors 20a-20d, with their sources 24a-24d coupled with a source bond-pad 24 and their drains 26a-26d coupled with a drain bond-pad 26 (FIG. 8A). The gate (e.g. 22a) of each transistor (e.g. 20a) is controlled by a control circuit (e.g. 36a). The array circuit 20 further comprises a decoder 30 and a test terminal 34. The inputs 30a, 30b of the decoder are the address of the transistor array 20.

Figure 8B:
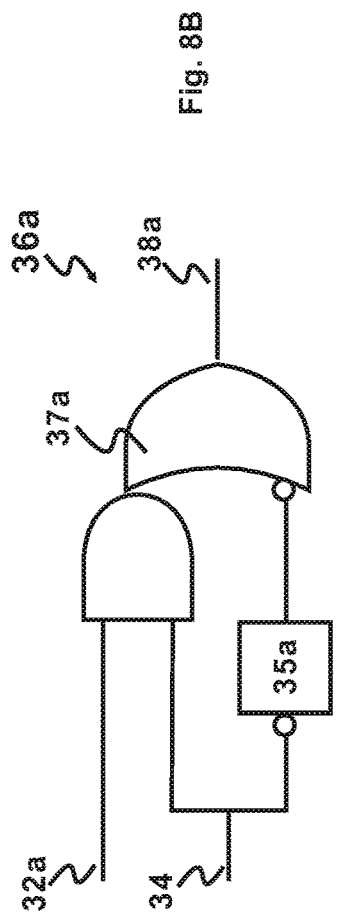
FIG. 8B is a circuit diagram of an associated control circuit.

The control circuit 36a comprises a memory 35a for storing the status of the associated transistor 20a. If the stored status is "1", the transistor 20a is defective; otherwise, the transistor 20a is normal (FIG. 8B). The memory 35a is preferably a non-volatile memory (NVM), e.g. a one-time programmable memory (OTP), or a multiple-time programmable memory (MTP). Exemplary NVMs include fuse, antifuse, flash, among others. It should be noted that the decoder 30 and the control circuit 36 can be integrated with the transistors 20a-20d into the array die 200, or located separately from the array die 200.

A self-test is performed on the preferred array circuit 20 at a regular interval. During this process, the test terminal 34 is first set to high. Then the inputs 30a, 30b of the decoder 30 is configured in such a way that the gate of a selected transistor (e.g. 20a) is set to high, with the gates of other transistors (e.g. 20b-20d) set to low. By measuring the resistance between the drain bond-pad 26 and the source bond-pad 24, the status of the selected transistor 20a can be determined. If the resistance is within range, the selected transistor 20a is normal; otherwise, the selected transistor 20a is defective. Finally, the test results are written into the memory 35a.

Right after the self-test, self-repair is performed to disable the defective transistor so that it would not generate output. At this moment, the test terminal 34 is set to low. A status is read out from each memory (e.g. 35a). For "1" (i.e. defective transistor), the drain voltage (e.g. 38a) is set to low and the corresponding transistor (e.g. 20a) do not generate output; for "1" (i.e. normal transistor), the drain voltages (e.g. 38b-38d) are set to high and the corresponding transistors (e.g. 20b-20d) generate outputs. The overall output 26 of the array circuit 20 is the sum of the outputs 26b-26d of all normal transistors 20b-20d. It should be noted that the above embodiment is described to enhancement-mode transistors (i.e. normally "OFF") as an example. The inventive spirit can be easily extended to depletion-mode transistors (normally "ON").

For the preferred array circuit 20, redundancy can be designed into the number of monolithic transistors. For example, even though a 10×10 transistor array 20 can meet the product requirements, a 10×11 transistor array 20 is designed in the real product. A 10% redundancy can greatly improve the reliability of the preferred array circuit 20. Once an aged transistor fails during usage, by simply disabling this failed transistor, the overall performance of the array circuit 20 won't be affected.

To improve the yield and/or reliability of a GaN-on-Si output transistor supporting a large voltage, the present invention further discloses a serial-connected transistor array. The large output transistor is decomposed into an array of serial-connected small monolithic output transistors, each of which is formed in a device region defined by a small monolithic GaN film. A defective transistor can be disabled by bypassing, i.e. shorting its source and drain. In the meantime, all normal transistors are communicatively coupled and generate output. FIGS. 10A-14B disclose more details on the preferred serial-connected transistor array.

Figures 10A, 10B:
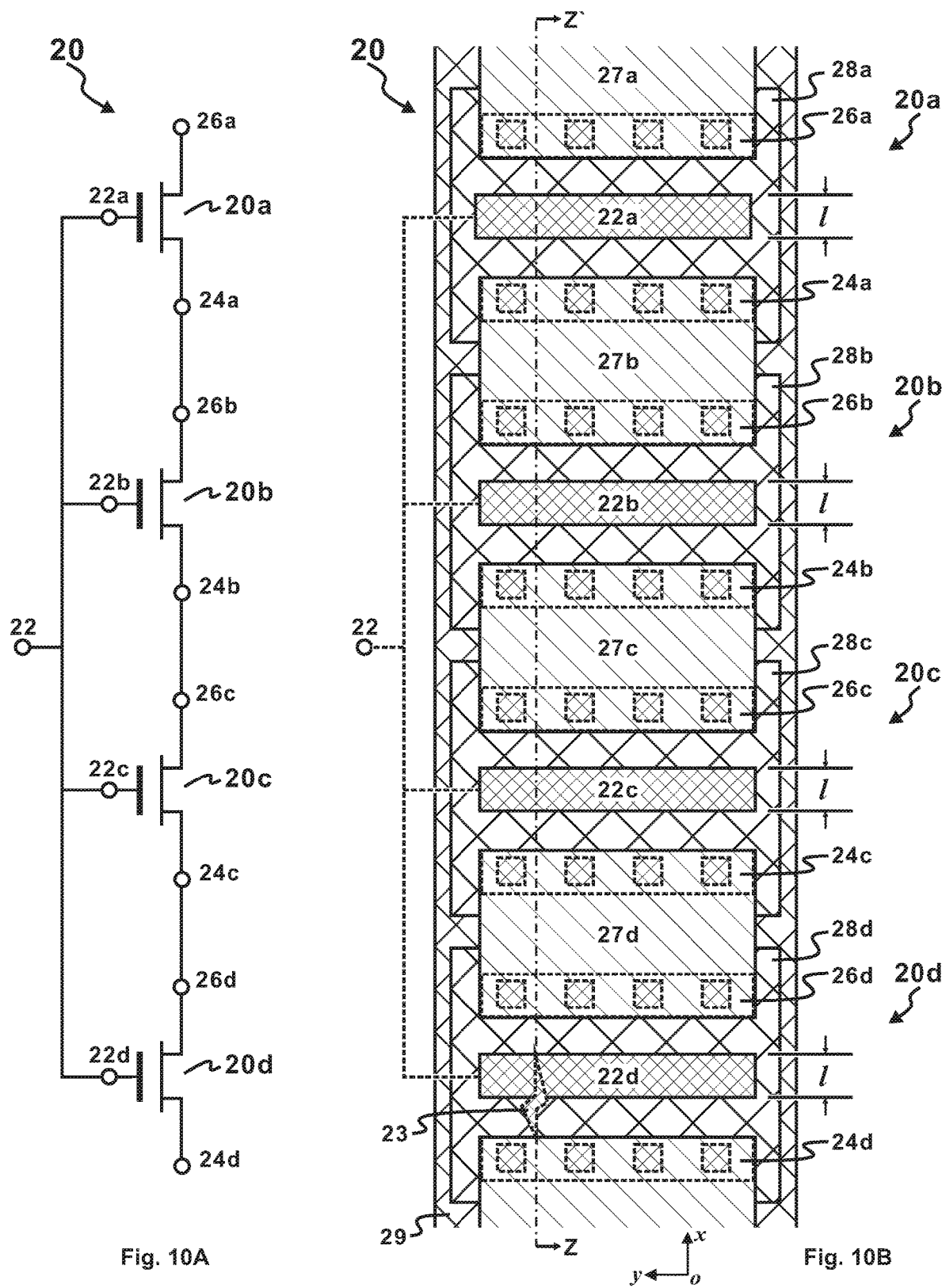
FIG. 10A is a circuit diagram of a preferred serial-connected transistor array before selective wiring.
FIG. 10B is its plan view.
Figure 10C:
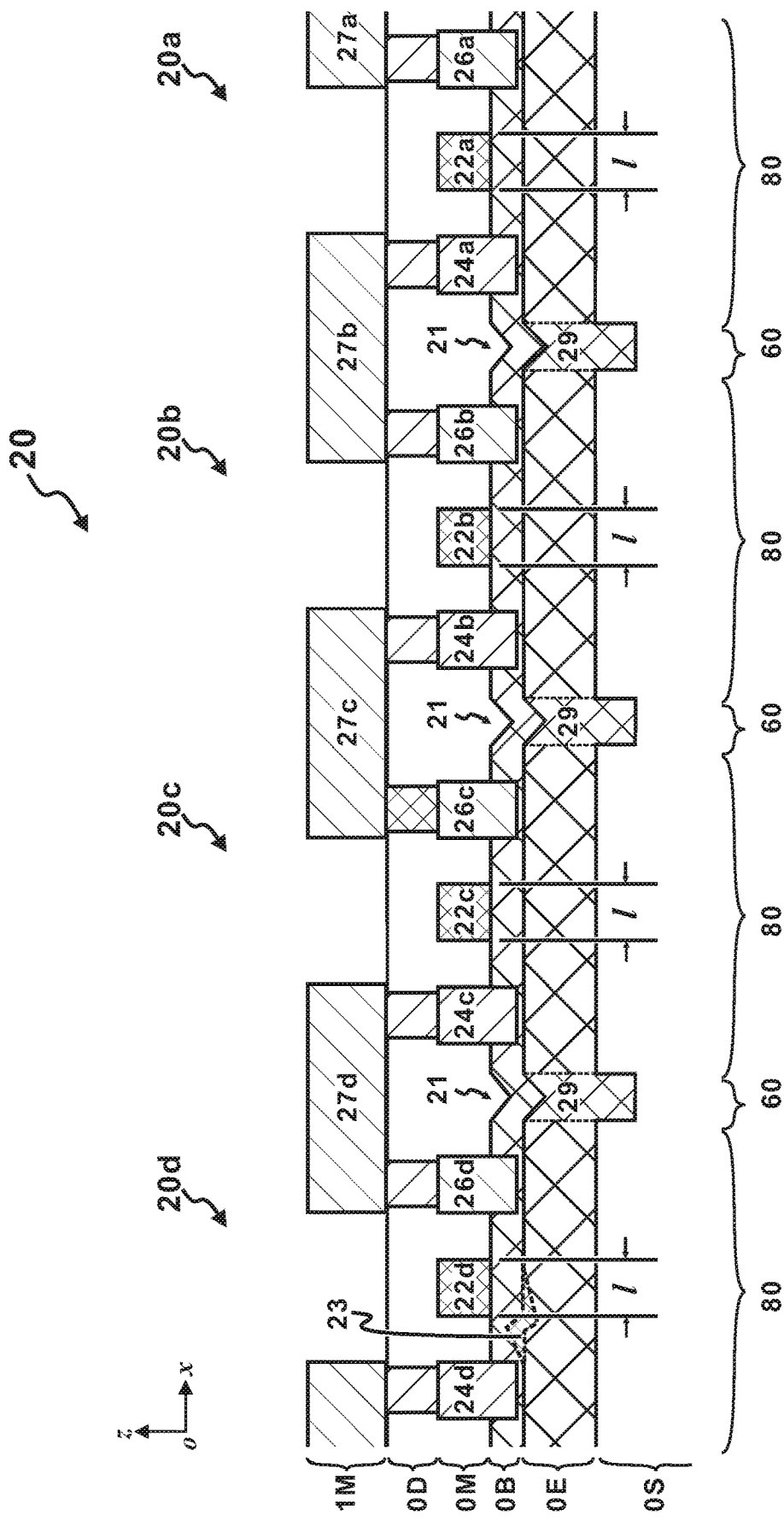
FIG. 10C is its cross-sectional view along the cut-line Z-Z'.

Referring now to FIGS. 10A-10C, a preferred serial-connected transistor array 20 before selective wiring is shown. In this example, the output transistor array 20 consists of four serially-connected transistors 20a-20d (FIG. 10A). Each transistor (e.g. 20a) has a gate (e.g. 22a), a source (e.g. 26a) and a drain (e.g. 24a). All gates 22a-22d are connected to a common gate terminal 22. The source (e.g. 24a) of a first transistor (e.g. 20a) is connected with the drain (e.g. 26b) of a second transistor (e.g. 20b) through the interconnect 27b in the metal layer 1M, the source (e.g. 24b) of the second transistor (e.g. 20b) is connected with the drain (e.g. 26c) of a third transistor (e.g. 20c) through the interconnect 27c, the source (e.g. 24c) of the third transistor (e.g. 20c) is connected with the drain (e.g. 26d) of a fourth transistor (e.g. 20d) through the interconnect 27d, and so on (FIGS. 10B-10C). Its manufacturing process is similar to that in FIGS. 3A-3B. For reason of simplicity, the boundary region 31 is not shown in FIG. 10C.

Figure 9A:
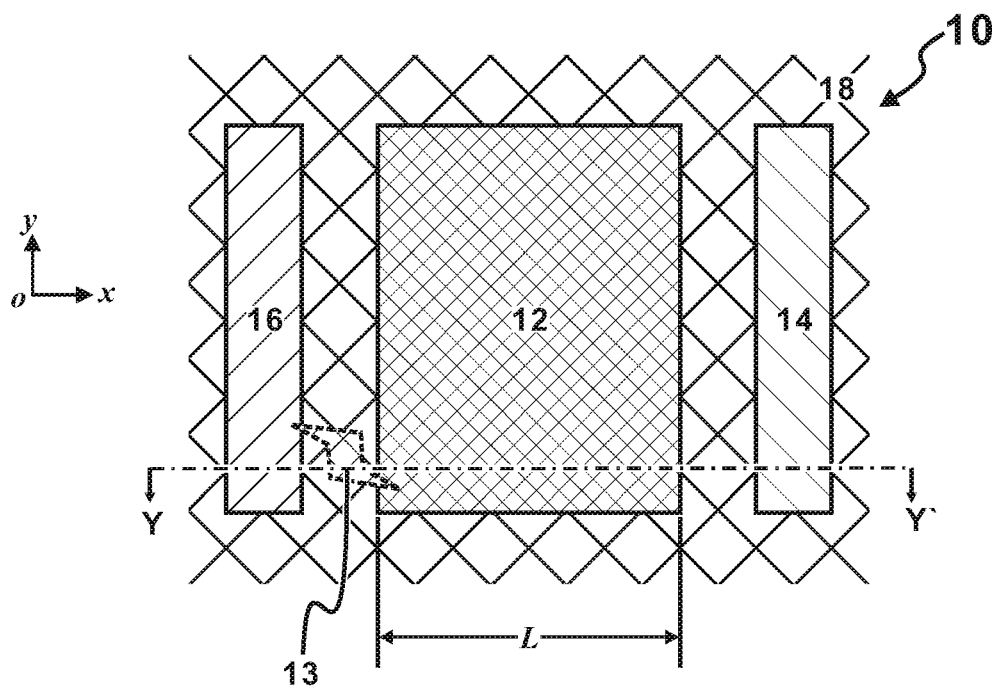
FIG. 9A is a plan view of a large monolithic output transistor supporting a large voltage (prior art)
Figure 9B:
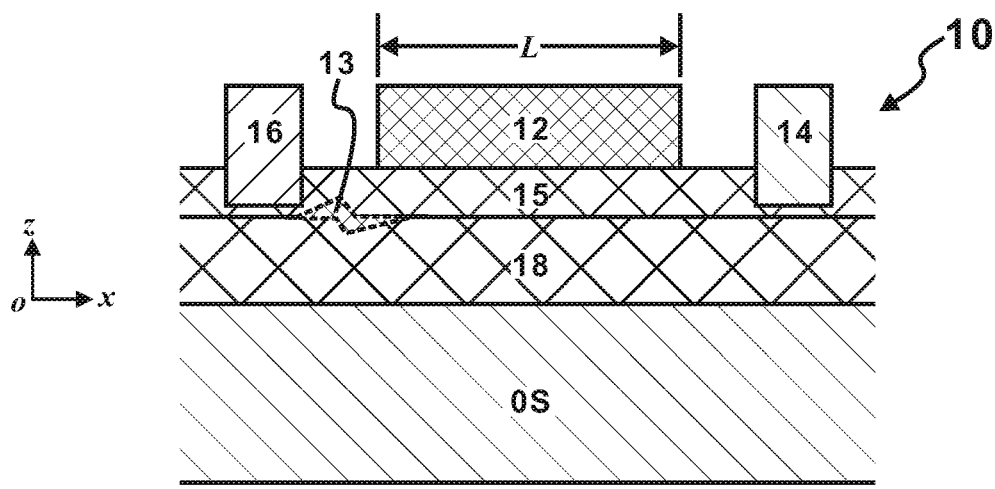
FIG. 9B is its cross-sectional view along the cut-line Y-Y' (prior art).

Compared with the transistor 10 of FIGS. 9A-9B, the transistors 20a-20d in FIGS. 10B-10C are small transistors while the transistor 10 is a large transistor. Because the large transistor 10 is decomposed into four serial-connected small transistors 20a-20d, the channel length 1 of each small transistor (e.g. 20a) is about a quarter of the channel length L of the large transistor 10. With a shorter channel length 1 and therefore a smaller footprint, the likelihood for the small transistors 20a-20d to contain a defect 23 becomes smaller. It should be apparent to those skilled in the art that, besides decomposing a large transistor 10 in length (i.e. along the x direction), the large transistor 10 can also be decomposed in width (i.e. along the y direction), like that in FIGS. 3A-3B. As a result, a large transistor 10 with a large length L and a large width W can be decomposed into an array of small transistors, each having a small length 1 and a small width w.

In the preferred embodiments of FIGS. 11-14B, the transistor 20a in the serial-connected transistor array 20 is a defective transistor; while all other transistors 20b-20d are normal transistors. To prevent it from affecting the overall performance of the transistor array 20, the defective transistor 20a needs to be disabled by bypassing.

Figure 11:
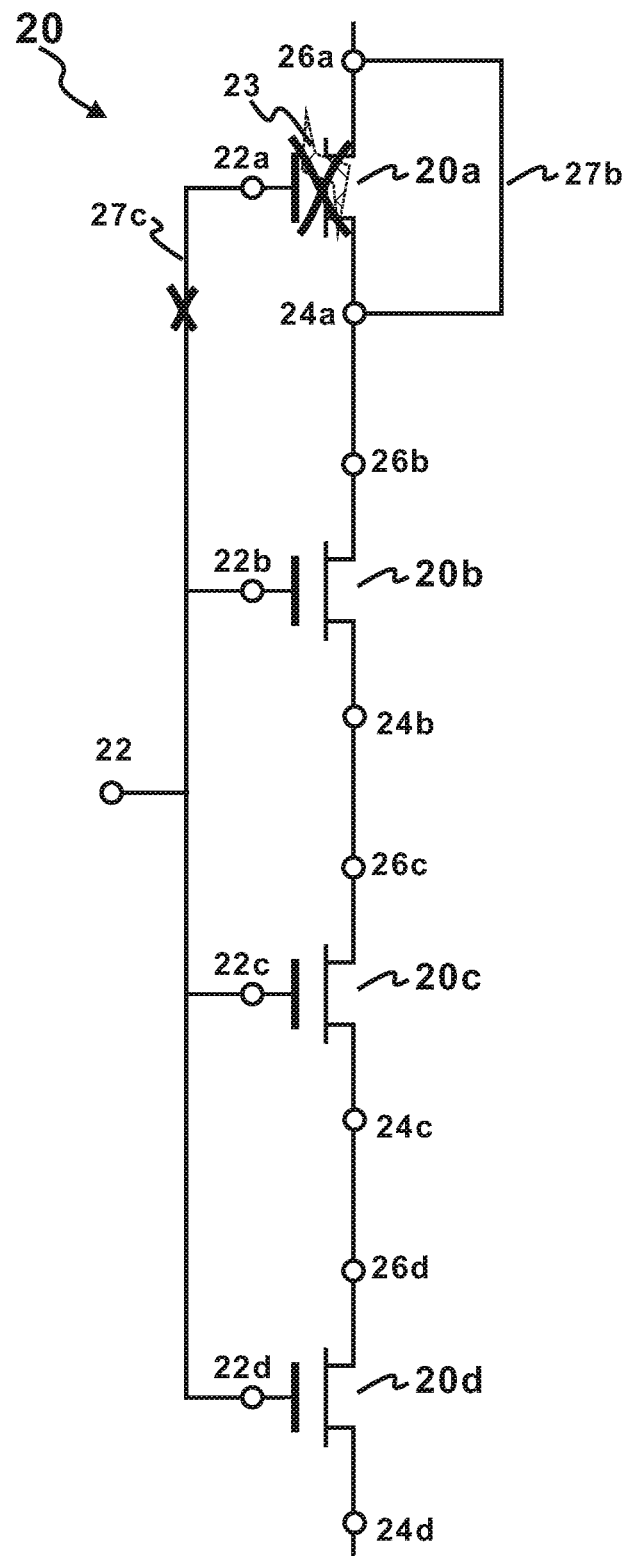
FIG. 11 is a circuit diagram of the preferred serial-connected transistor array after selective wiring.

Referring now to FIG. 11, the preferred serial-connected transistor array 20 after selective wiring is disclosed. For selective wiring, a wire 27b shorts together the source 26a and the drain 24a of the defective transistor 20a. As a result, the preferred output transistor array 20 functions correctly. In addition, the wire 27c connecting the gate 22a of the defective transistor 20a and the common gate terminal 22 can be cut.

The voltage rating for the preferred transistor array 20 in FIG. 11 degrades after selective wiring. For example, without the defective transistor 20a, the voltage rating for the preferred transistor array 20 (with four normal transistors 20a-20d) is 100 volts. However, with the defective transistor 20a, the voltage rating for the preferred transistor array 20 after selective wiring (with three normal transistors 20b-20d) is 75 volts.

FIGS. 12-14B disclose several preferred embodiments using selective wiring. Among them, the first preferred embodiment in FIG. 12 uses selective bonding; the second preferred embodiment in FIGS. 13A-13B uses selective deposition; and, the third preferred embodiment in FIGS. 14A-14B uses selective cutting.

Figure 12:
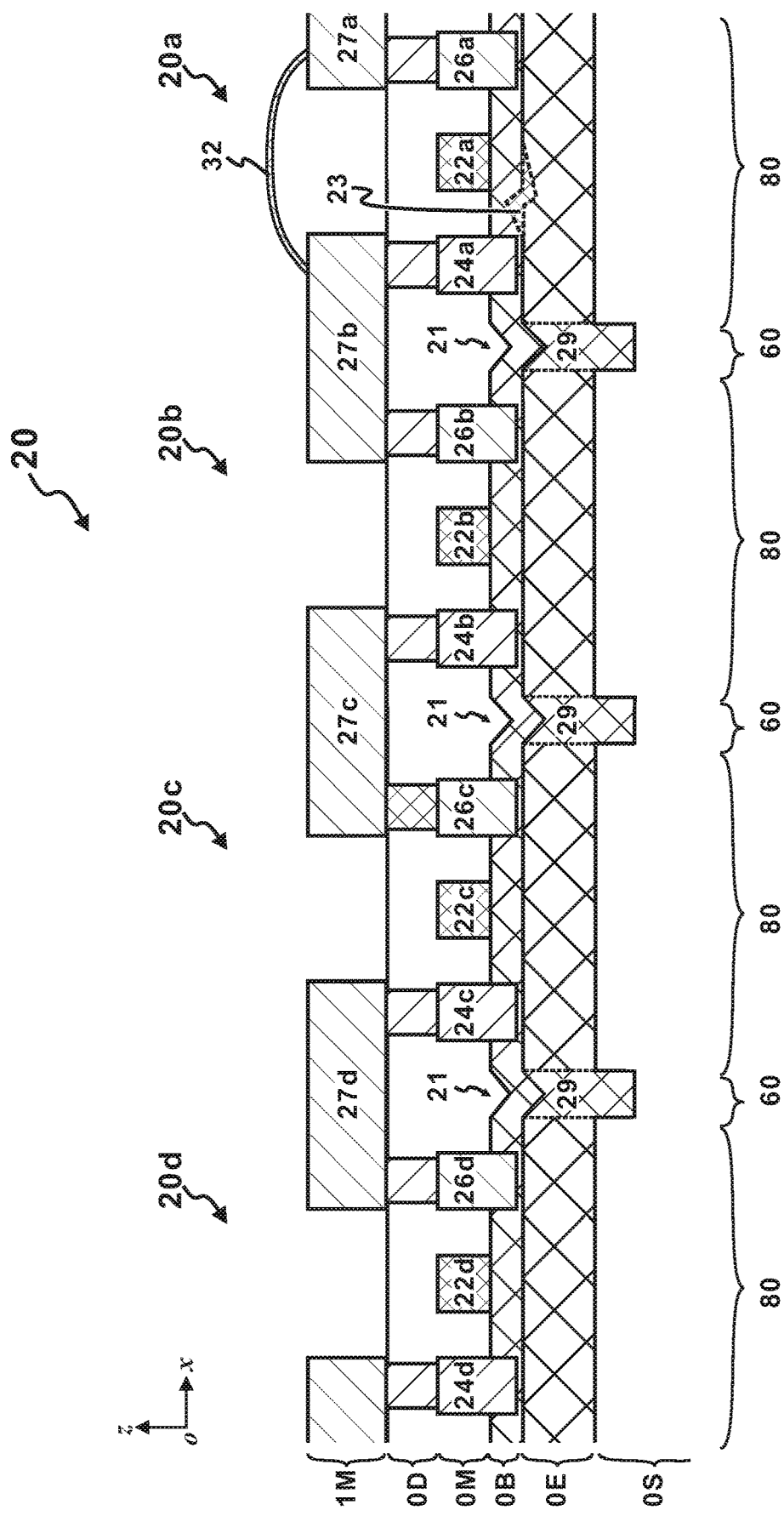
FIG. 12 is a cross-sectional view of a first preferred implementation of FIG. 11.

Referring now to FIG. 12, a first preferred serial-connected transistor array 20 after selective bonding is disclosed. The interconnects 27a-27d formed by the second metal layer 1M are similar to those of FIG. 10C and the transistors 20a-20d are serially connected. To avoid malfunction of the entire transistor array 20 due to a single defect 23, a bond wire 32 connects a first interconnect 27a with a second interconnect 27b. Because the defective device 20a is bypassed, the preferred transistor array 20 functions correctly.

Figure 13A:
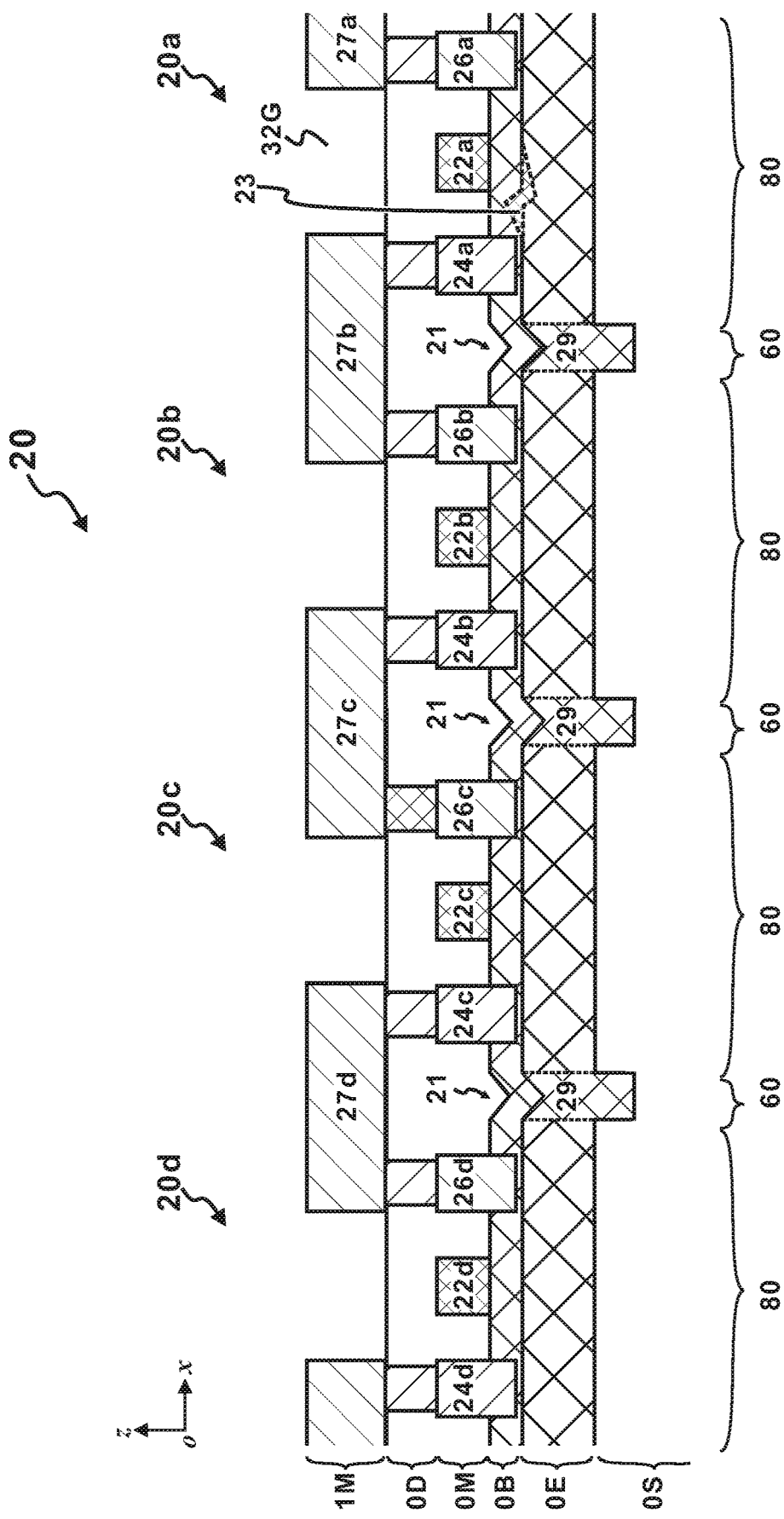
FIGS. 13A-13B are cross-sectional views of a second preferred implementation of FIG. 11 before and after selective deposition.
Figure 13B:
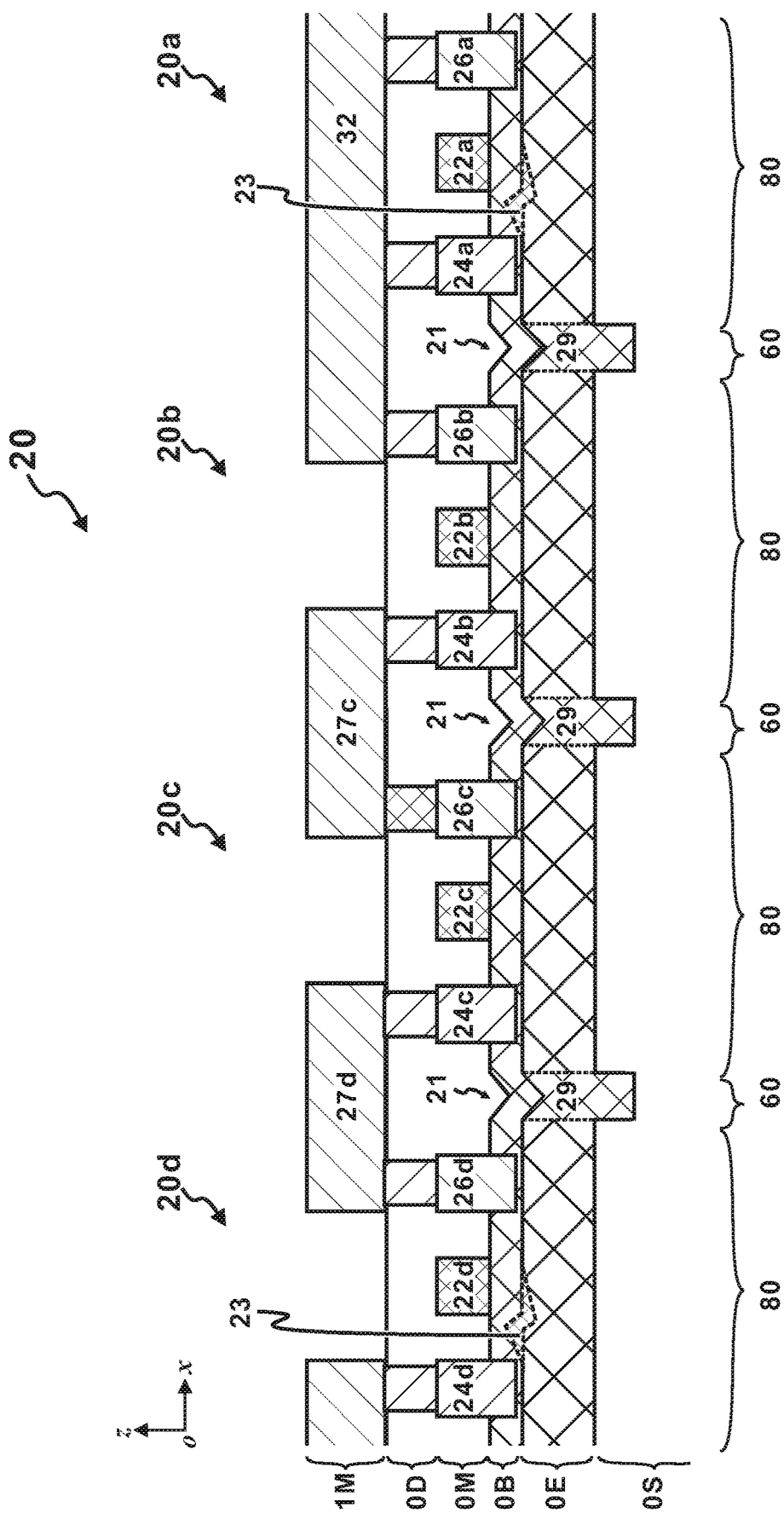

Referring now to FIGS. 13A-13B, a second preferred serial-connected transistor array 20 before and after selective deposition is disclosed. Before selective deposition, interconnects 27a-27b formed by the second metal layer 1M (FIG. 13A) are similar to those of FIG. 10C and the transistors 20a-20d are serially connected. To avoid malfunction of the entire transistor array 20 due to a single defect 23, a focused ion beam (FIB) selectively deposits metallic ion in the gap 32G between the first interconnect 27a and the second interconnect 27b (FIG. 13B). Because the defective device 20a is bypassed, the preferred transistor array 20 functions correctly.

Figure 14A:
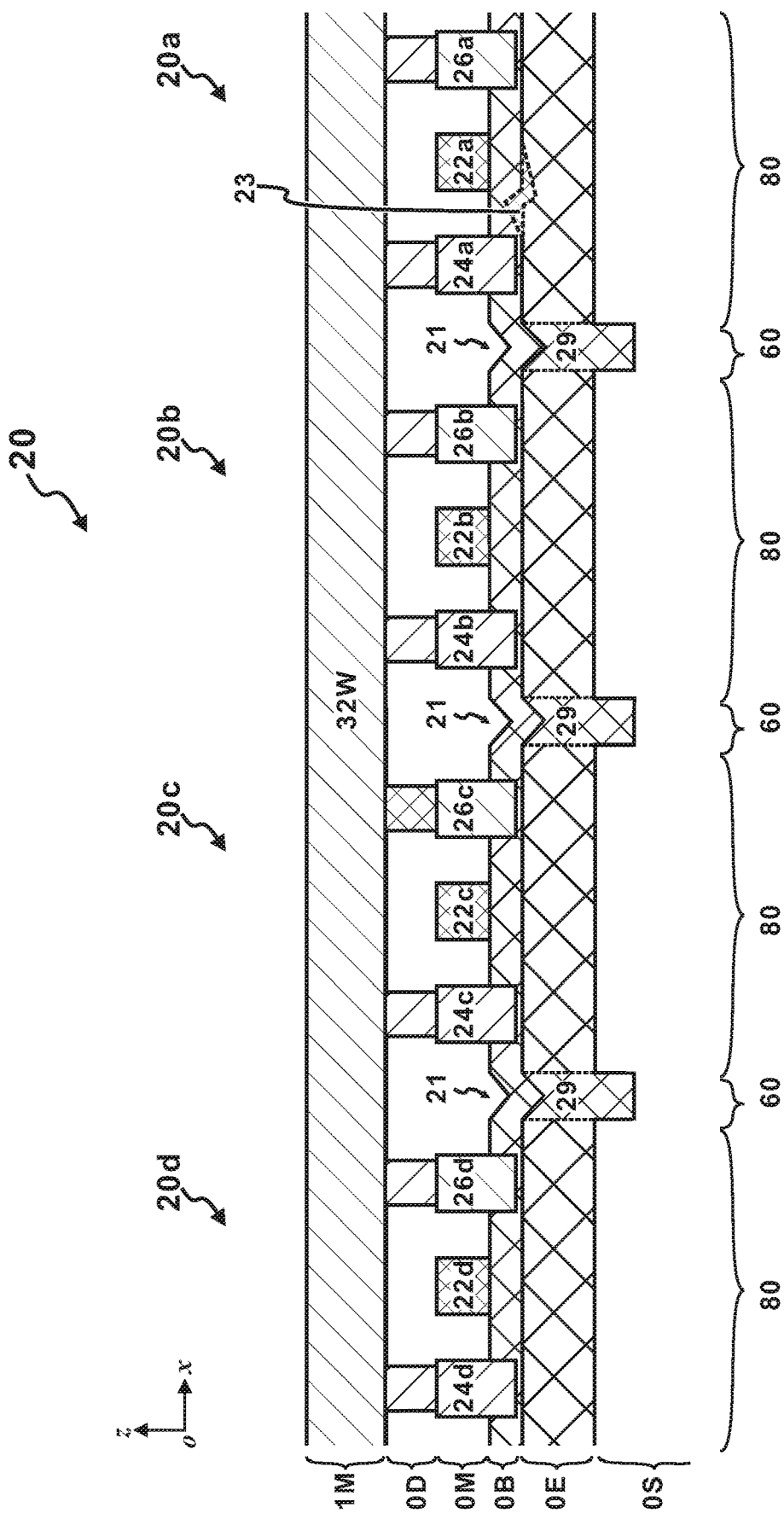
FIGS. 14A-14B are cross-sectional views of a third preferred implementation of FIG. 11 before and after selective cutting.
Figure 14B:
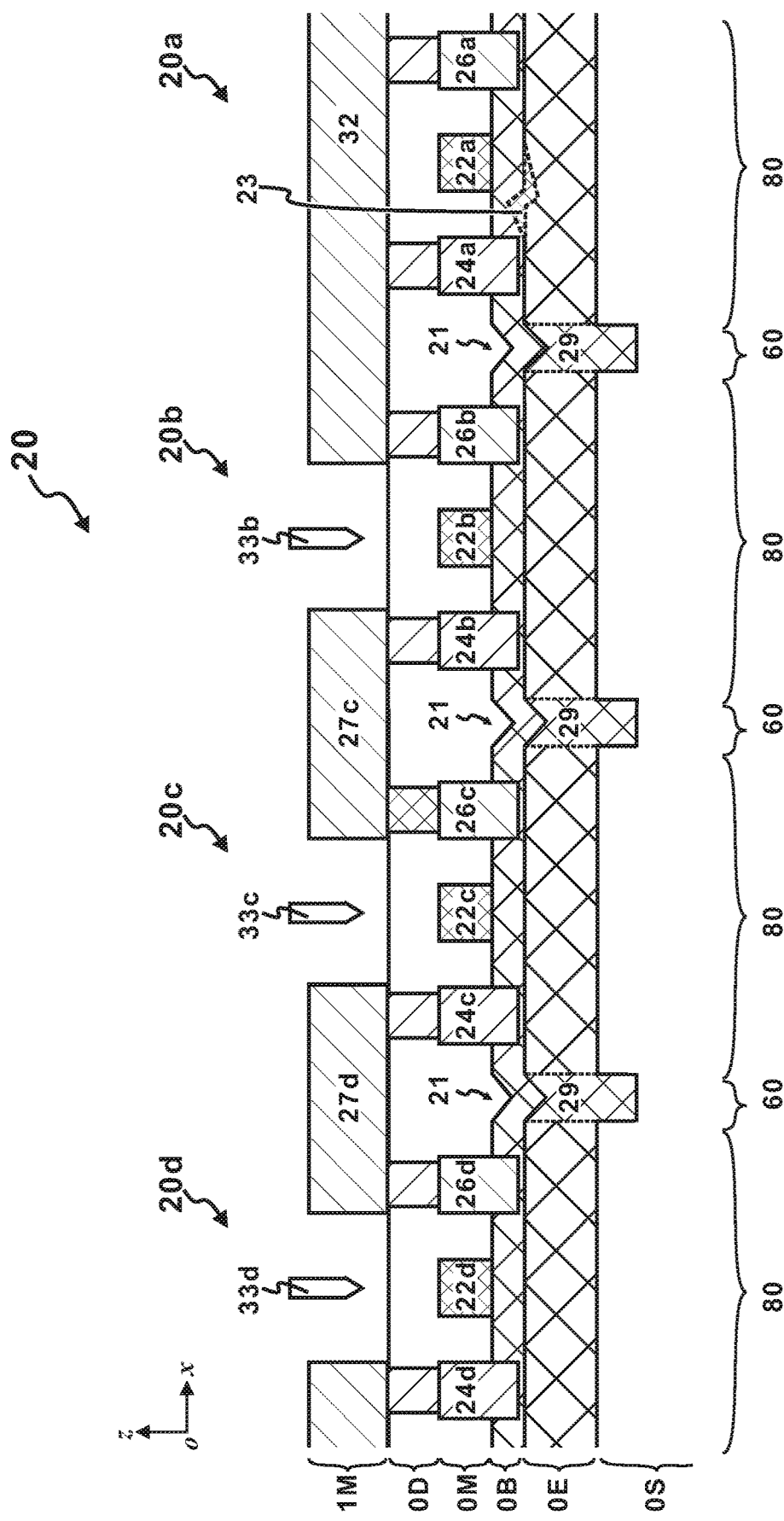

Referring now to FIGS. 14A-14B, a third preferred serial-connected transistor array 20 before and after selective cutting is disclosed. Before selective cutting, the overall interconnect 32W shorts the sources 24a-24d and drains 26a-26d of all transistors 20a-20d together (FIG. 14A). To avoid malfunction of the entire transistor array 20 due to a single defect 23, a laser beam (or, an FIB used in a cutting mode) selectively cuts the overall interconnect 32W at locations 33b-33d (FIG. 14B). Because the defective device 20a is bypassed, the preferred transistor array 20 functions correctly.

To improve the productivity of the output transistor array 20, the present invention further discloses a multiple-patterned substrate. It uses at least two types of grids: a first grid 60 surrounds each monolithic transistor (e.g. 20a) and separates adjacent monolithic transistors (e.g. 20a, 20b); and, a second grid surrounds the whole transistor array. The first grid 60 uses separation structures 21 with a small width S, which can partially relieve stress while maintaining a good substrate efficiency. The second grid 70 uses boundary structures 31 with a large width R, which can relieve stress more effectively. To achieve a good productivity, the second grid 70 preferably coincides with the dicing streets. Hence, even though wide boundary structures 31 are used, the second grid 70 would not use the valuable die area. FIG. 15A-18B disclose several preferred multiple-patterned substrate. Among them, the preferred embodiments in FIGS. 15A-16B uses concave structures; the preferred embodiment in FIGS. 17A-17B uses convex structures; while the preferred embodiment in FIGS. 18A-18B uses planar structures.

Referring now to FIGS. 15A-15B, the substrate surface 48 is continuous and smooth in the device region 80; the concave structure in the separation region 60 is a first trench 21 with a width S; and, the concave structure in the boundary region 70 is a second trench 31 with a width R (FIG. 15A). During epitaxy, a layer of the GaN film 28 is grown using a method such as MOCVD. The thickness t of the GaN film 28 generally satisfies the following requirements: S<2t<R. After epitaxy, the first trench 21 is filled with the GaN film 29; however, the second trench 31 is not fully filled with the GaN film 39.

As used hereinafter the bottom interface of the GaN film is the exposed surface before epitaxy starts. Because it is the surface upon which epitaxy is performed, the bottom interface plays an important role to the quality of the GaN film grown thereon. In this preferred embodiment, the bottom interfaces 48, 41, 51 of the GaN films 28, 29, 39 are different: the bottom interface 48 is located at a different physical level than the bottom interfaces 41, 51; and, the bottom interfaces 41 and 51 have different physical widths. Accordingly, the GaN films 28, 29, 39 have different characteristics: the GaN film 28 has the lowest defect density and is suitable for transistors; the GaN film 29 has some defects and can partially relieve stress; the GaN film 39 has the highest defect density. Because cracks can be easily developed, the GaN film 39 can relieve stress more effectively (FIG. 15B).

The preferred embodiment in FIGS. 16A-16B is similar to that in FIGS. 15A-15B. They both use trenches as the separation structure 21 and the boundary structure 31. The only difference is that the depth d1 of the first trench 21 differs from the depth d2 of the second trench 31 (FIG. 16A). In this preferred embodiment, the difference between the bottom interfaces 31 and 51 is even more severe (relative to that in FIGS. 15A-15B). A deeper second trench 31 can generate cracks more easily and therefore, relieve stress more effectively (FIG. 16B).

Figure 17A:
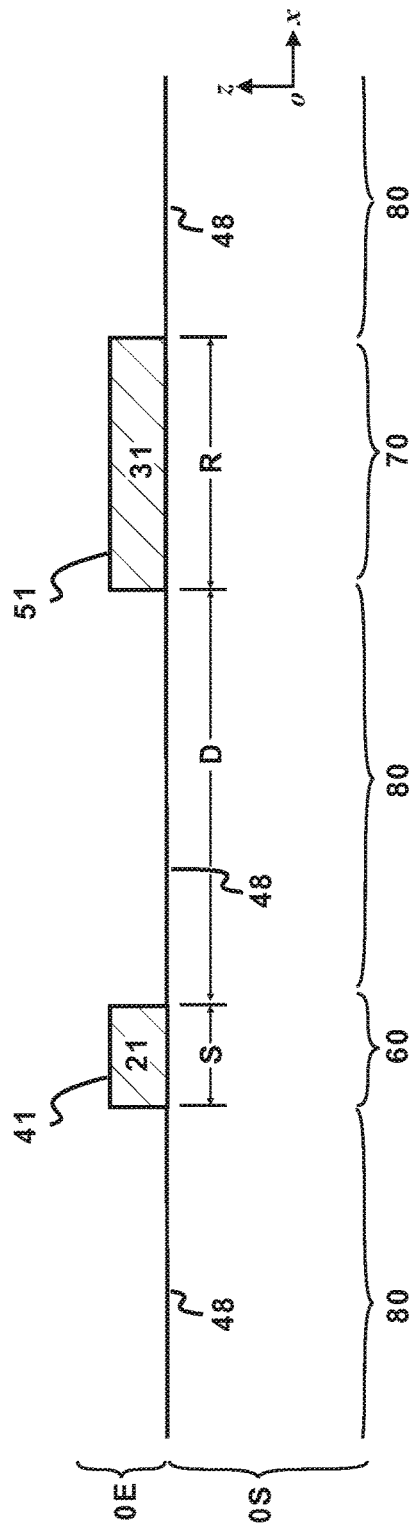
FIG. 17A is a cross-sectional view of a third preferred substrate pattern before epitaxial growth.
Figure 17B:
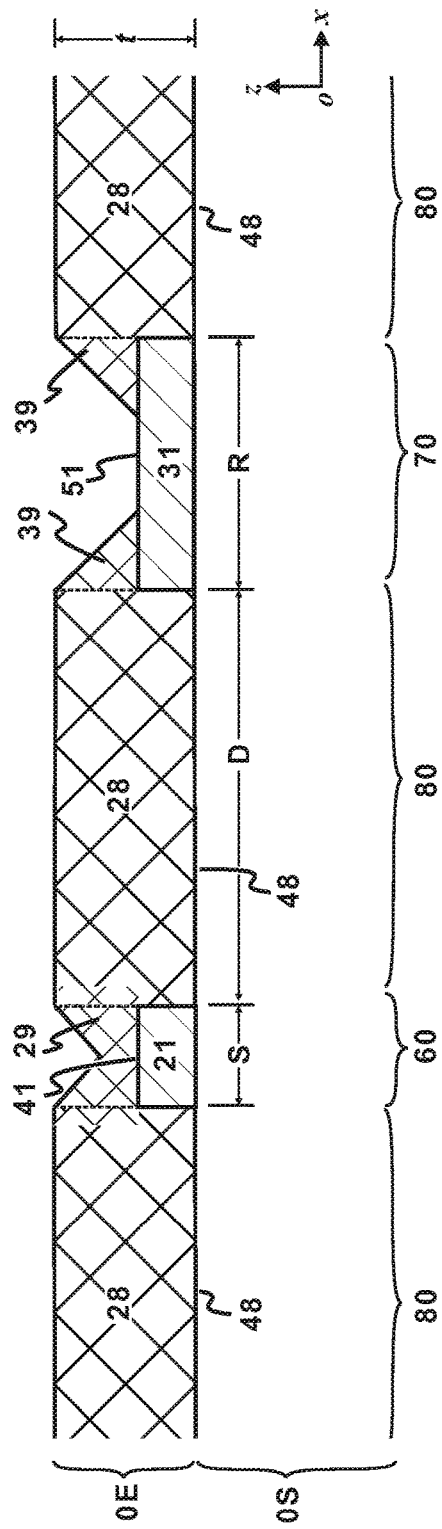
FIG. 17B is a cross-sectional view of a third preferred GaN film after epitaxial growth.

Referring now to FIGS. 17A-17B, the separation structure 21 and the boundary structures both use convex structures, e.g. posts. The posts 21, 31 comprise materials such as silicon oxide and/or silicon nitride (FIG. 17A). In this preferred embodiment, the hetero-epitaxy is a selective epitaxy, i.e. the GaN film is only grown on the substrate surface 48 in the device region 80, but not on the surfaces 41, 51 of the posts 21, 31. It should be noted that because of lateral overgrowth, portions of GaN films 29, 39 are still formed on the posts 21, 31. For the first post 21, the laterally grown GaN film 29 will coalesce because of the small width S. For the second post 31, the laterally grown GaN film 39 won't coalesce because of the large width R. As a result, cracks can be easily developed on the second post 31 and help to relieve stress (FIG. 17B). More details on hetero-epitaxy on the convex structures are disclosed in U.S. Pat. No. 7,914,747 B2 by Matsushita and issued on Mar. 29, 2011.

Figure 18A:
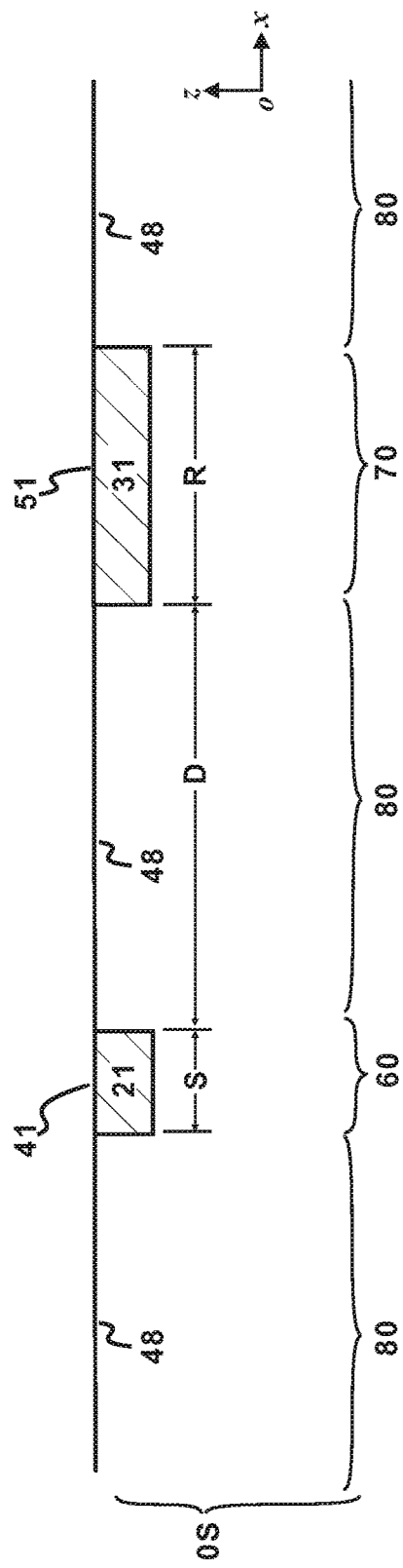
FIG. 18A is a cross-sectional view of a fourth preferred substrate pattern before epitaxial growth.
Figure 18B:
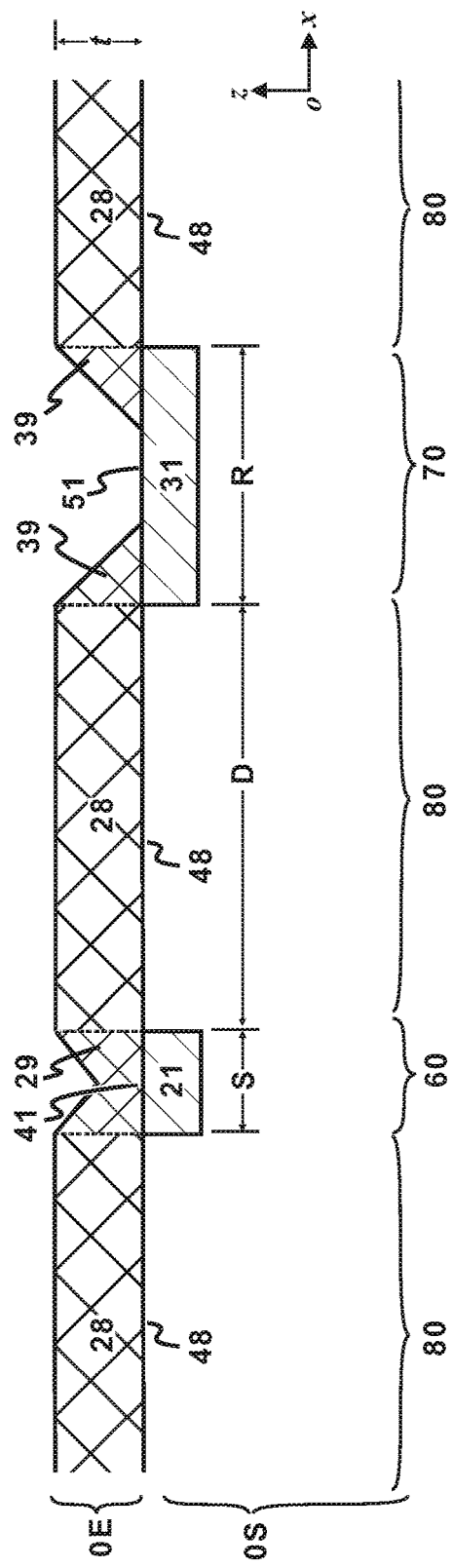
FIG. 18B is a cross-sectional view of a fourth preferred GaN film after epitaxial growth.

The preferred embodiment in FIGS. 18A-18B uses planar structures. Similarly, the separation structure 21 and the boundary structure 31 comprise materials such as silicon oxide and/or silicon nitride. Their top surfaces 41, 51 are level with the substrate surface 48 (FIG. 18A). In this preferred embodiment, the hetero-epitaxy is a selective epitaxy, i.e. the GaN film is only grown on the substrate surface 48 in the device region 80, but not on the surfaces 41, 51 of the separation structure 21 and the boundary structure 31. Because of lateral overgrowth, portions of GaN films 29, 39 are still formed on the separation structure 21 and the boundary structure 31. For the separation structure 21, the laterally grown GaN film 29 will coalesce because of the small width S. For the boundary structure 31, the laterally grown GaN film 39 won't coalesce because of the large width R. As a result, cracks can be easily developed on the boundary structure 31 and help to relieve stress (FIG. 18B).

Although embodiments are disclosed for the GaN film grown epitaxially on the silicon substrate, it should be apparent to those skilled in the art that the inventive spirit of the present invention can be extended to other epitaxial semiconductor films and devices. For example, the substrate could comprises a substrate material such as silicon, sapphire, silicon carbide (SiC), gallium arsenide (GaAs); the semiconductor film could comprise a semiconductor material such as GaN, GaAs, AlGaAs, GaAsP, AlGaInP, GaP, ZnSe, InGaN, AlGaN, AlN. The transistors in the present invention could be MOSFET, MESFET, MISFET, HEMT and others. The inventive spirit can also be extended to other semiconductor output devices. One important example is diodes, e.g. light-emitting diodes (LED), photo-diodes, solar cells, among others.

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. A hetero-epitaxial output device array, comprising:
   a substrate comprising a substrate material;
   a semiconductor film grown epitaxially on said substrate comprising a semiconductor material with different lattice constant and/or thermal expansion coefficient from said substrate material, wherein said semiconductor film comprises first, second and third device regions separated by at least a separation region, the semiconductor films in said first, second and third device regions are different from the semiconductor film in said separation region;
   first, second and third output devices respectively formed in said first, second and third device regions, wherein said first output device is a defective device and disabled, said second and third output devices are normal devices and communicatively coupled.

2. The output device array according to claim 1, further comprising a boundary region surrounding the whole of said output device array, wherein the semiconductor film in said boundary region is different from the semiconductor film in said separation region and the semiconductor films in said first, second and third device regions.

3. The output device array according to claim 2, wherein the width of said boundary region is larger than the width of said separation region.

4. The output device array according to claim 1, wherein said second and third output device are parallel connected.

5. The output device array according to claim 1, wherein said second and third output device are serial connected.

6. The output device array according to claim 1, wherein said first output device is not communicatively coupled with said second and third output devices.

7. The output device array according to claim 1, wherein at least two terminals of said first output device are shorted together.

8. The output device array according to claim 1, further comprising at least a memory for storing the data related to a test result performed to said first, second or third output devices.

9. A hetero-epitaxial output device array, comprising:
   a substrate comprising a substrate material;
   a semiconductor film grown epitaxially on said substrate comprising a semiconductor material with different lattice constant and/or thermal expansion coefficient from said substrate material, wherein said semiconductor film comprises a plurality of device regions separated by at least a separation region, the semiconductor films in said plurality of device regions are different from the semiconductor film in said separation region;
   a plurality of output devices respectively formed in said plurality of device regions, said output devices including at least a defective output device and a plurality of normal output devices, wherein said defective output device is disabled; and, said normal output devices are communicatively coupled.

10. The output device array according to claim 9, further comprising a boundary region surrounding the whole of said output device array, wherein the semiconductor film in said boundary region is different from both the semiconductor film in said separation region and the semiconductor films in said plurality of device regions.

11. The output device array according to claim 10, wherein the width of said boundary region is larger than the width of said separation region.

12. The output device array according to claim 9, wherein said normal output device are parallel connected.

13. The output device array according to claim 9, wherein said normal output device are serial connected.

14. The output device array according to claim 9, wherein said defective device is not communicatively coupled with said normal output devices.

15. The output device array according to claim 9, wherein at least two terminals of said defective output device are shorted together.

16. The output device array according to claim 9, further comprising at least a memory for storing the data related to a test result performed to said output devices in a test mode.

17. A hetero-epitaxial semiconductor device, comprising:
a substrate comprising a substrate material;
a semiconductor film grown epitaxially on said substrate comprising a semiconductor material with different lattice constant and/or thermal expansion coefficient from said substrate material, wherein said semiconductor film comprises a plurality of device regions;
at least a separation region surrounding selected one of said plurality of device regions;
a boundary region surrounding all of said plurality of device regions;
wherein the semiconductor films in said device regions, the semiconductor film in said separation region and the semiconductor film in said boundary region are different.

18. The semiconductor device according to claim 17, wherein the width of said boundary region is larger than the width of said separation region.

19. The semiconductor device according to claim 17, wherein the bottom interface of the semiconductor films in said device regions, the bottom interface of the semiconductor film in said separation region, the bottom interface of the semiconductor film in said boundary region are different.

20. The semiconductor device according to claim 17, wherein at least a portion of said boundary region comprises none of said semiconductor film.

* * * * *